United States Patent
Pan et al.

(10) Patent No.: US 10,131,534 B2
(45) Date of Patent: Nov. 20, 2018

(54) STACKED VIAS FOR VERTICAL INTEGRATION

(75) Inventors: Yaoling Pan, San Diego, CA (US); Lixia Zhou, Milpitas, CA (US)

(73) Assignee: SnapTrack, Inc., San Diego, CA (US)

( * ) Notice: Subject to any disclaimer, the term of this patent is extended or adjusted under 35 U.S.C. 154(b) by 1112 days.

(21) Appl. No.: 13/278,080

(22) Filed: Oct. 20, 2011

(65) Prior Publication Data

US 2013/0100143 A1  Apr. 25, 2013

(51) Int. Cl.
G09G 5/00 (2006.01)
B81B 7/00 (2006.01)
B81C 1/00 (2006.01)

(52) U.S. Cl.
CPC ........ B81B 7/0006 (2013.01); B81C 1/00246 (2013.01)

(58) Field of Classification Search
CPC .... B81B 7/0006; B81C 1/00246; H01L 21/00
USPC .......................................... 345/501; 359/290
See application file for complete search history.

(56) References Cited

U.S. PATENT DOCUMENTS

| | | | |
|---|---|---|---|
| 5,798,283 | A | 8/1998 | Montague et al. |
| 6,562,656 | B1 | 5/2003 | Ho |
| 7,488,428 | B2 | 2/2009 | Lee et al. |
| 7,570,415 | B2 | 8/2009 | Sasagawa |
| 7,733,552 | B2 | 6/2010 | Londergan et al. |
| 7,777,715 | B2 | 8/2010 | Chui et al. |
| 2003/0234415 | A1 * | 12/2003 | Chien ................. H01L 23/5223 257/303 |
| 2005/0041405 | A1 | 2/2005 | Kawagoe |
| 2005/0067633 | A1 | 3/2005 | Mushika |
| 2006/0205106 | A1 * | 9/2006 | Fukuda ............... B81C 1/00246 438/52 |
| 2008/0029898 | A1 | 2/2008 | Farooq et al. |
| 2009/0040136 | A1 * | 2/2009 | Lan ..................... G02B 26/001 345/30 |
| 2009/0189290 | A1 | 7/2009 | Kacker et al. |

(Continued)

FOREIGN PATENT DOCUMENTS

| | | |
|---|---|---|
| CN | 101728355 A | 6/2010 |
| CN | 102001613 A | 4/2011 |

(Continued)

OTHER PUBLICATIONS

International Search Report and Written Opinion—PCT/US2012/060648—ISA/EPO—dated Mar. 18, 2013.

(Continued)

*Primary Examiner* — Mark Edwards
(74) *Attorney, Agent, or Firm* — Weaver Austin Villeneuve & Sampson LLP—QUAL

(57) ABSTRACT

This disclosure provides systems, methods and apparatus for a via structure. In one aspect, an apparatus includes a substrate and a first electromechanical systems device on a surface of the substrate. The first electromechanical systems device includes a first metal layer and a second metal layer. A first via structure can be included on the surface of the substrate. The first via structure includes the first metal layer, the second metal layer, and a third metal layer. The first metal layer of the first electromechanical systems device may be the same metal layer as the first metal layer of the first via structure.

22 Claims, 18 Drawing Sheets

(56) References Cited

U.S. PATENT DOCUMENTS

| | | | | |
|---|---|---|---|---|
| 2010/0246152 A1* | 9/2010 | Lin | ................... | H01L 23/60 361/783 |
| 2011/0008962 A1* | 1/2011 | Huang | ................ | B81C 1/00246 438/669 |
| 2011/0220399 A1* | 9/2011 | Niki | ................ | H05K 1/115 174/258 |

FOREIGN PATENT DOCUMENTS

| | | |
|---|---|---|
| EP | 1695937 A2 | 8/2006 |
| EP | 2360999 A1 | 8/2011 |
| JP | 2004335506 A | 11/2004 |
| JP | 2006090740 A | 4/2006 |
| JP | 2006156704 A | 6/2006 |
| JP | 2006263902 A | 10/2006 |
| JP | 2009124318 A | 6/2009 |
| JP | 2009170669 A | 7/2009 |
| JP | 2009188402 A | 8/2009 |
| JP | 2010067647 A | 3/2010 |
| JP | 2010283189 A | 12/2010 |
| WO | WO-2008005108 A2 | 1/2008 |
| WO | WO-2008115716 A2 | 9/2008 |
| WO | WO-2009020801 | 2/2009 |

OTHER PUBLICATIONS

Chinese Office Action dated Jun. 25, 2015, issued in Application No. 201280059040.2.
Japanese Office Action dated Jul. 6, 2015, issued in Application No. 2014-537185.

* cited by examiner

Common Voltages

| | $VC_{ADD\_H}$ | $VC_{HOLD\_H}$ | $VC_{REL}$ | $VC_{HOLD\_L}$ | $VC_{ADD\_L}$ |
|---|---|---|---|---|---|
| $VS_H$ | Stable | Stable | Relax | Stable | Actuate |
| $VS_L$ | Actuate | Stable | Relax | Stable | Stable |

Segment Voltages

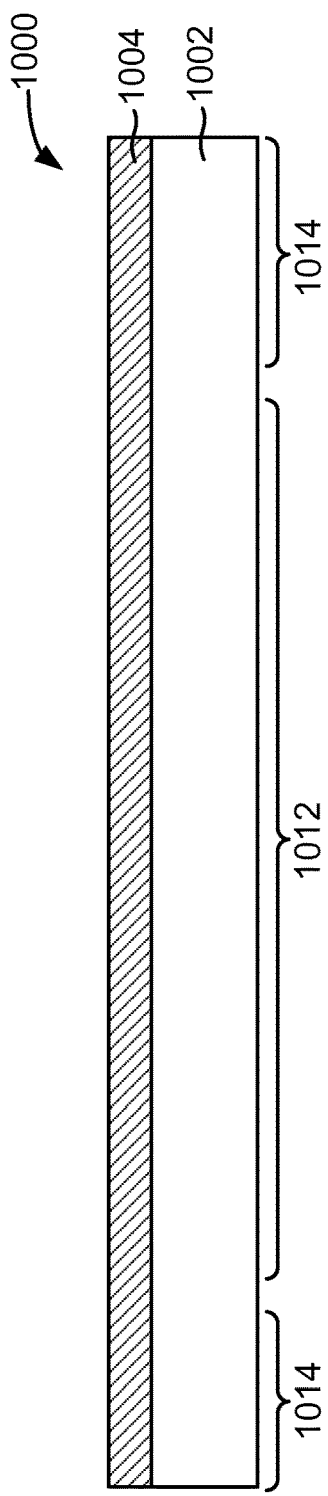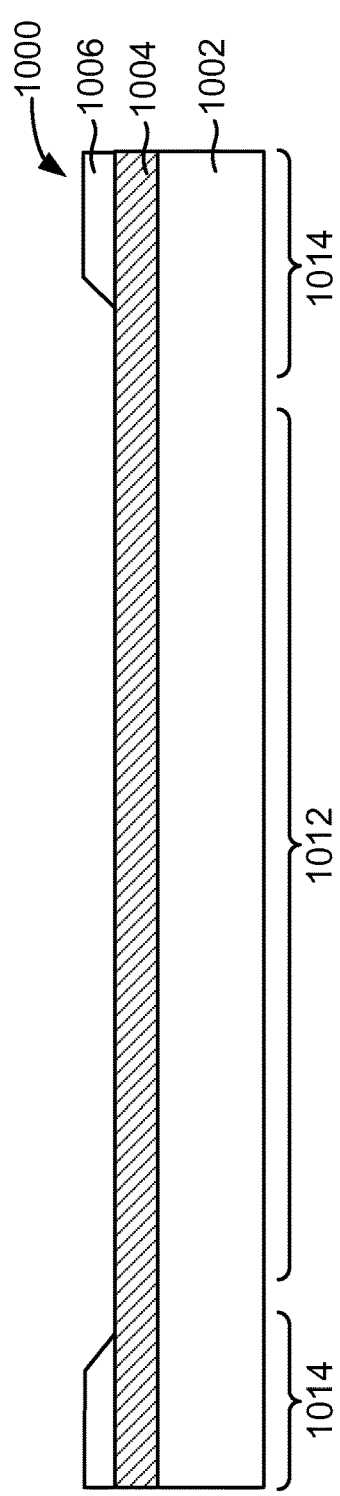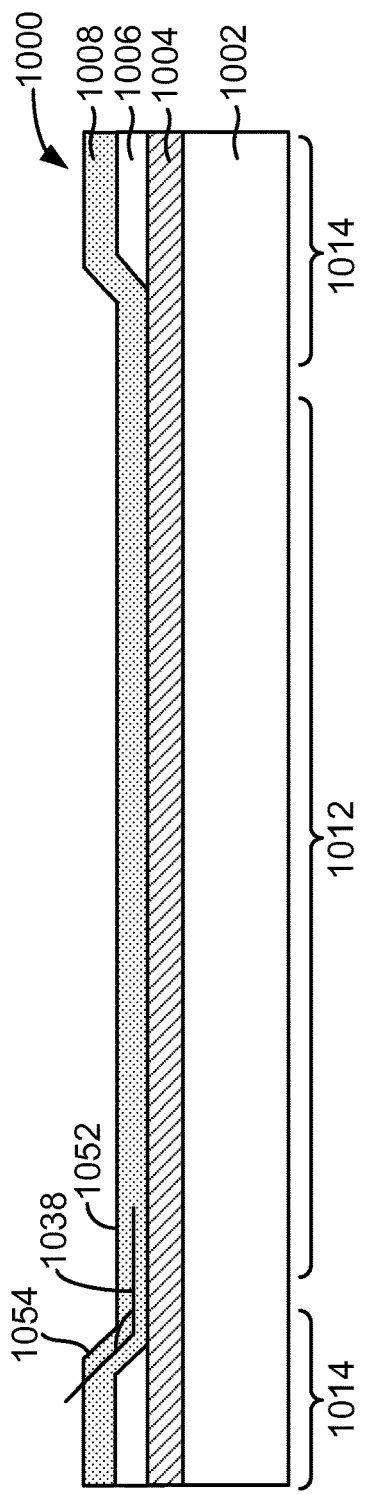
Figure 10A
Figure 10B
Figure 10C

STACKED VIAS FOR VERTICAL INTEGRATION

TECHNICAL FIELD

This disclosure relates generally to via structures and more particularly to via structures for electromechanical systems (EMS) devices.

DESCRIPTION OF THE RELATED TECHNOLOGY

Electromechanical systems (EMS) include devices having electrical and mechanical elements, actuators, transducers, sensors, optical components (including mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Vias and conductive traces may be used to electrically connect EMS devices to one another or to other components. For example, vias and conductive traces may allow electrical connection between different layers of material that are included in EMS devices on a substrate.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus including a substrate, a first electromechanical systems (EMS) device on a surface of the substrate, and a first via structure on the surface of the substrate. The first EMS device may include a first metal layer and a second metal layer. The first via structure may include the first metal layer, the second metal layer, and a third metal layer. The second metal layer may be disposed on the first metal layer, and the third metal layer may be disposed on the second metal layer at a central portion of the first via structure. The first metal layer of the first EMS device may be coupled to the first metal layer of the first via structure. The first metal layer of the first EMS device and the first metal layer of the first via structure may be the same metal layers.

In some implementations, the first metal layer, the second metal layer, and the third metal layer of the first via structure may be in electrical contact with one another at the central portion of the first via structure. In some implementations, the apparatus may further include a plurality of dielectric layers between the metal layers in peripheral portions to the first via structure, with the central portion of the first via structure not including the peripheral portions of the first via structure.

Another innovative aspect of the subject matter described in this disclosure can be implemented in an apparatus including a substrate, a first electromechanical systems (EMS) device on a surface of the substrate, and a first via structure on the surface of the substrate. The first EMS device may include a first metal layer and a second metal layer. The first via structure may include the first metal layer, the second metal layer, a third metal layer, and a fourth metal layer. The second metal layer may be disposed on the first metal layer, the third metal layer may be disposed on the second metal layer, and the fourth metal layer may be disposed on the third metal layer at a central portion of the first via structure. The first metal layer of the first EMS device may be coupled to the first metal layer of the first via structure. The first metal layer of the first EMS device and the first metal layer of the first via structure may be the same metal layers.

In some implementations, the first metal layer, the second metal layer, the third metal layer, and the fourth metal layer of the first via structure may be in electrical contact with one another at the central portion of the first via structure. In some implementations, the apparatus may further include a plurality of via structures, the plurality of via structures including the first via structure and a second via structure. The second via structure may include the second metal layer, the third metal layer, and the fourth metal layer. The third metal layer may be disposed on the second metal layer and the fourth metal layer may be disposed on the third metal layer at a central portion of the second via structure.

Another innovative aspect of the subject matter described in this disclosure can be implemented in a method including depositing a first metal layer on a surface of a substrate. The first metal layer may be patterned. A first dielectric layer may be deposited. The first dielectric layer may be patterned to expose the first metal layer in a central portion of a first via structure. A second metal layer may be deposited. A portion of the second metal layer may contact the first metal layer in the central portion of the first via structure. The second metal layer may be patterned. A second dielectric layer may be deposited. The second dielectric layer may be patterned to expose the second metal layer in the central portion of the first via structure. A third metal layer may be deposited. A portion of the third metal layer may contact the second metal layer in the central portion of the first via structure.

In some implementations, patterning the second dielectric layer may further expose the second metal layer in a central portion of a second via structure. Another portion of the third metal layer may contact the second metal layer in the central portion of the second via structure.

In some implementations, the patterned first metal layer may include a trace to a device on the surface of the substrate. In some implementations, the patterned first metal layer forms part of a device on the surface of the substrate. In some implementations, the device may be a thin-film transistor device, and in some other implementations, the device may be an EMS device.

Details of one or more implementations of the subject matter described in this specification are set forth in the accompanying drawings and the description below. Although the examples provided in this disclosure are primarily described in terms of electromechanical systems (EMS) and microelectromechanical systems (MEMS)-based displays, the concepts provided herein may apply to other types of displays, such as liquid crystal displays, organic light-emitting diode ("OLED") displays and field emission displays. Other features, aspects, and advantages will become apparent from the description, the drawings and the claims. Note that the relative dimensions of the following figures may not be drawn to scale.

BRIEF DESCRIPTION OF THE DRAWINGS

FIGS. 10A-10E show examples of cross-sectional schematic illustrations of a stacked via structure at different stages in the process described in FIG. 9.

Like reference numbers and designations in the various drawings indicate like elements.

DETAILED DESCRIPTION

Figure 1:
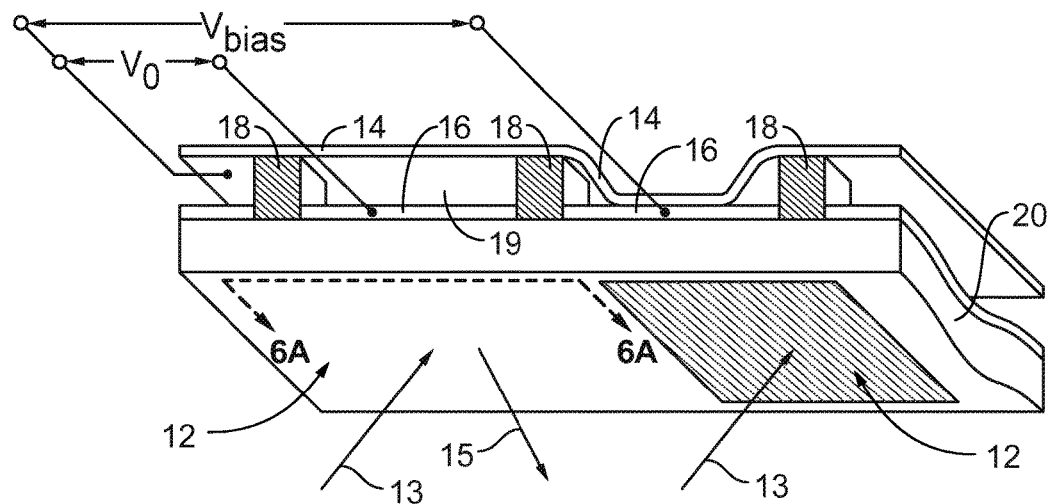
FIG. 1 shows an example of an isometric view depicting two adjacent pixels in a series of pixels of an interferometric modulator (IMOD) display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Some implementations described herein related to stacked via structures and processes to fabricate stacked via structures for the interconnection of devices associated with a substrate. In some implementations, a stacked via structure allows for the vertical integration or interconnection of devices associated with a substrate and for signal routing between different layers formed on the substrate. A stacked via structure may include a plurality of metal layers. The plurality of metal layers may be in contact with one another at a central portion of the stacked via structure. The plurality of metal layers may have dielectric layers disposed between the metal layers in peripheral portions of the stacked via structure and in regions extending beyond the peripheral portions of the stacked via structure.

For example, in some implementations, an apparatus may include a substrate with a first electromechanical systems (EMS) device on a surface of the substrate. The first EMS device may include a first metal layer and a second metal layer. The apparatus may further include a first via structure on the surface of the substrate. The first via structure may include the first metal layer, the second metal layer, and a third metal layer. The second metal layer may be disposed on the first metal layer and the third metal layer may be disposed on the second metal layer at a central portion of the first via structure. The first metal layer of the first EMS device may be coupled to the first metal layer of the first via structure, with the first metal layer of the first EMS device and the first metal layer of the first via structure being the same metal layers.

Particular implementations of the subject matter described in this disclosure can be implemented to realize one or more of the following potential advantages. A stacked via structure may have a small form factor as compared to other conventional vias, such as staggered vias and direct vias. A small form factor can be advantageous in pixel device applications, such as display and imaging sensors. A small form factor also can be advantageous for on panel or on-chip integrated solutions for the interconnections between pixels and electronic components, such as thin-film transistors (TFTs), storage capacitors, or resistors. Stacked via structures can be implemented to route signals between local pixels, as well as throughout a pixel array, and even between pixel arrays. Stacked via structures also can be implemented to route signals between pixel arrays and on panel or on-chip drive circuits, as well as between the panel and external electronic components. Further, in some implementations, stacked via structures may be easier to fabricate than other via structures, and may be compatible with other commercially available thin film processes. For example, making stacked via structures may not require the cost and complexity of damascene processes, including, for example, chemical-mechanical polishing (CMP) or other planarization processes. As another example, making stacked via structures may not require the cost and complexity of laser drilling vias having different dimensions (e.g., sub-micron to tens of microns) through different layers of materials with different thicknesses (e.g., from tens of nanometers to a few microns). Manufacturing stacked via structures can be scalable to large format substrates, such as glass and flexible foils, and can even be used with roll-to-roll substrates. Additionally, stacked via structures may add flexibility in the routing of signals from the bottom-up or from the top-down.

An example of a suitable EMS or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity, i.e., by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when actuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows 13 indicating light incident upon the pixels 12, and light 15 reflecting from the IMOD 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the IMOD 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 um, while the gap 19 may be less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the IMOD 12 on the left in FIG. 1, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated IMOD 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
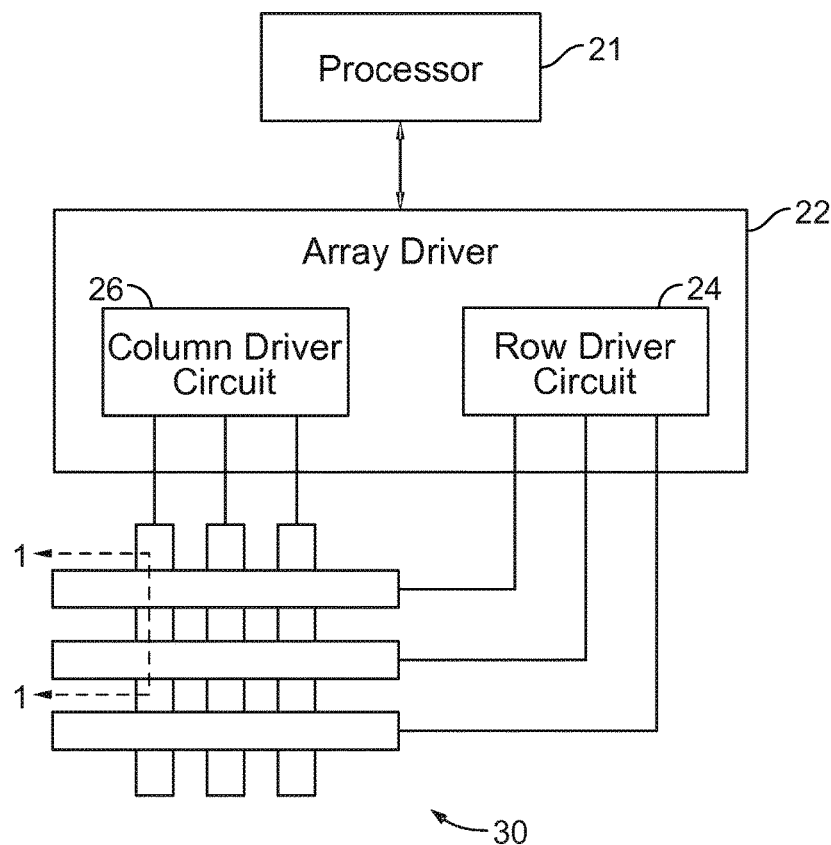
FIG. 2 shows an example of a system block diagram illustrating an electronic device incorporating a 3×3 interferometric modulator display.

FIG. 2 shows an example of a system block diagram illustrating an electronic device incorporating a 3×3 interferometric modulator display. The electronic device includes a processor 21 that may be configured to execute one or more software modules. In addition to executing an operating system, the processor 21 may be configured to execute one or more software applications, including a web browser, a telephone application, an email program, or other software application.

The processor 21 can be configured to communicate with an array driver 22. The array driver 22 can include a row driver circuit 24 and a column driver circuit 26 that provide signals to, e.g., a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
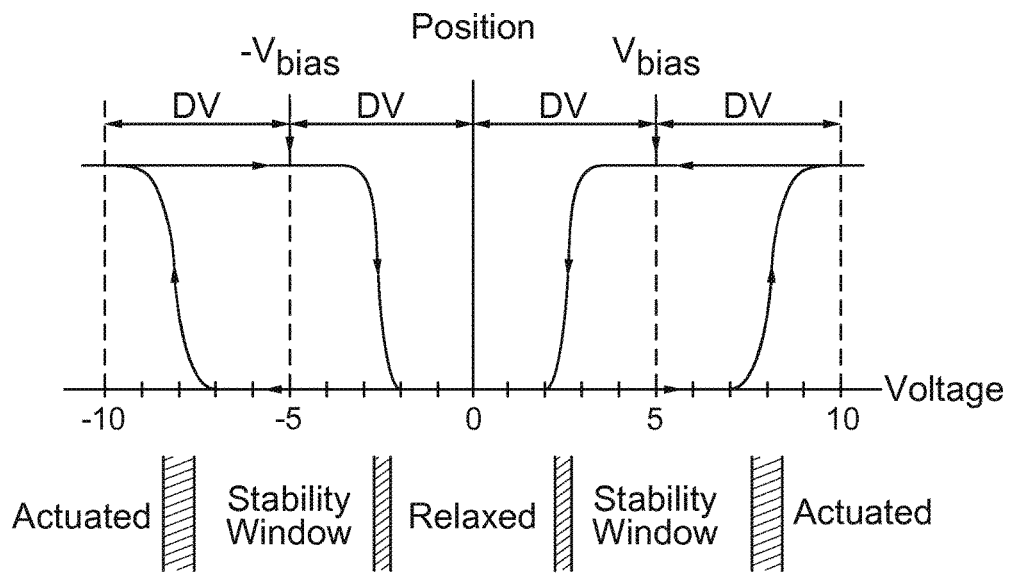
FIG. 3 shows an example of a diagram illustrating movable reflective layer position versus applied voltage for the interferometric modulator of FIG. 1.
FIG. 4 shows an example of a table illustrating various states of an interferometric modulator when various common and segment voltages are applied.

FIG. 3 shows an example of a diagram illustrating movable reflective layer position versus applied voltage for the interferometric modulator of FIG. 1. For MEMS interferometric modulators, the row/column (i.e., common/segment) write procedure may take advantage of a hysteresis property of these devices as illustrated in FIG. 3. An interferometric modulator may require, for example, about a 10-volt potential difference to cause the movable reflective layer, or mirror, to change from the relaxed state to the actuated state. When the voltage is reduced from that value, the movable reflective layer maintains its state as the voltage drops back below, e.g., 10 volts, however, the movable reflective layer does not relax completely until the voltage drops below 2 volts. Thus, a range of voltage, approximately 3 to 7 volts, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about 10 volts, and pixels that are to be relaxed are exposed to a voltage difference of near zero volts. After addressing, the pixels are exposed to a steady state or bias voltage difference of approximately 5-volts such that they remain in the previous strobing state. In this example, after being addressed, each pixel sees a potential difference within the "stability window" of about 3-7 volts. This hysteresis property feature enables the pixel design, e.g., illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment"

voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an interferometric modulator when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all interferometric modulator elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the interferometric modulator will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which always produce the same polarity potential difference across the modulators. In some other implementations, signals can be used which alternate the polarity of the potential difference of the modulators. Alternation of the polarity across the modulators (that is, alternation of the polarity of write procedures) may reduce or inhibit charge accumulation which could occur after repeated write operations of a single polarity.

Figure 5A:
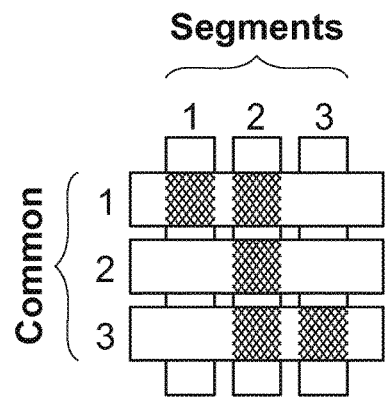
FIG. 5A shows an example of a diagram illustrating a frame of display data in the 3×3 interferometric modulator display of FIG. 2.
Figure 5B:
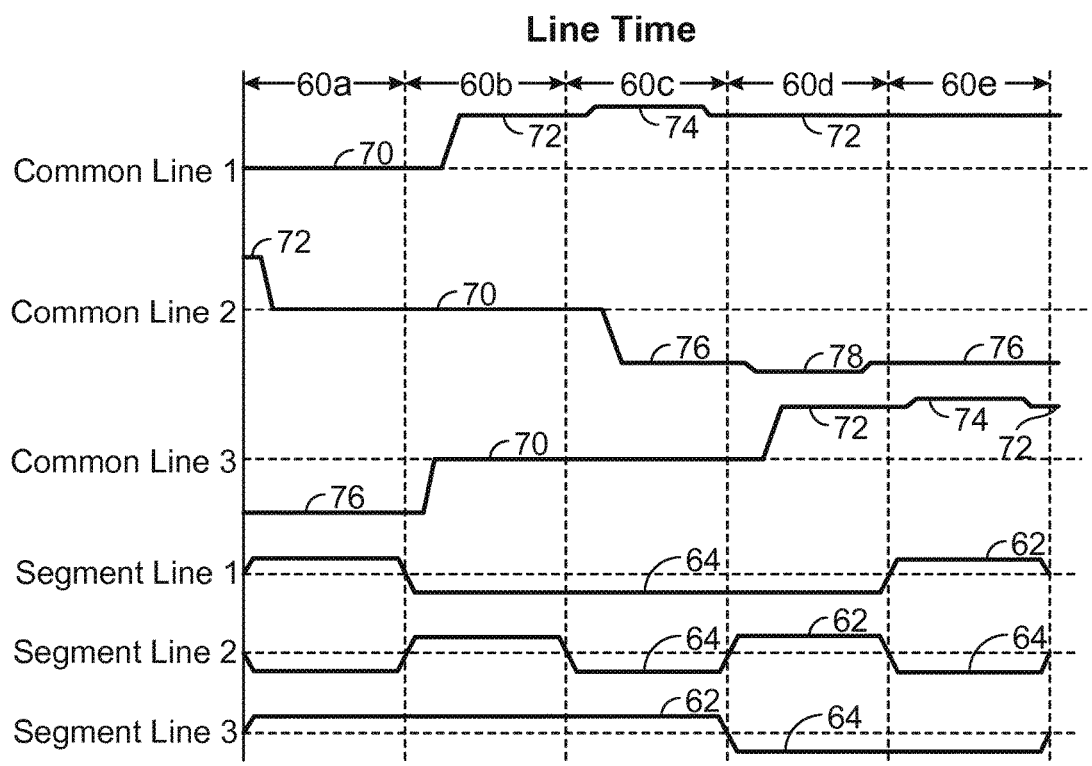
FIG. 5B shows an example of a timing diagram for common and segment signals that may be used to write the frame of display data illustrated in FIG. 5A.

FIG. 5A shows an example of a diagram illustrating a frame of display data in the 3×3 interferometric modulator display of FIG. 2. FIG. 5B shows an example of a timing diagram for common and segment signals that may be used to write the frame of display data illustrated in FIG. 5A. The signals can be applied to the, e.g., 3×3 array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, e.g., a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a, a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the interferometric modulators, as none of common lines 1, 2 or 3 are being exposed to voltage levels causing actuation during line time 60a (i.e., $VC_{REL}$-relax and $VC_{HOLD\_L}$-stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60*c*, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60*c*, the voltage along common line 2 decreases to a low hold voltage 76, and the voltage along common line 3 remains at a release voltage 70, leaving the modulators along common lines 2 and 3 in a relaxed position.

During the fourth line time 60*d*, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60*e*, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60*e*, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60*a*-60*e*) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the necessary line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
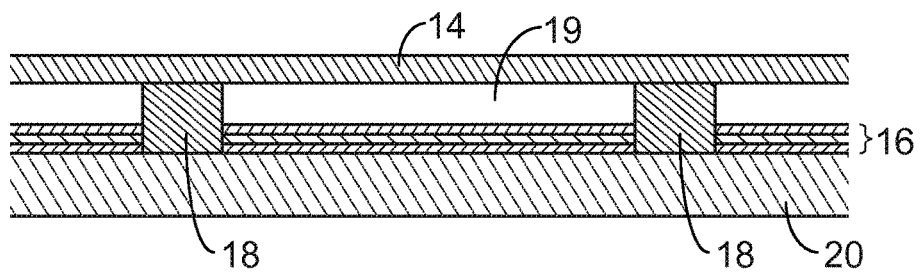
FIG. 6A shows an example of a partial cross-section of the interferometric modulator display of FIG. 1.
Figure 6B:
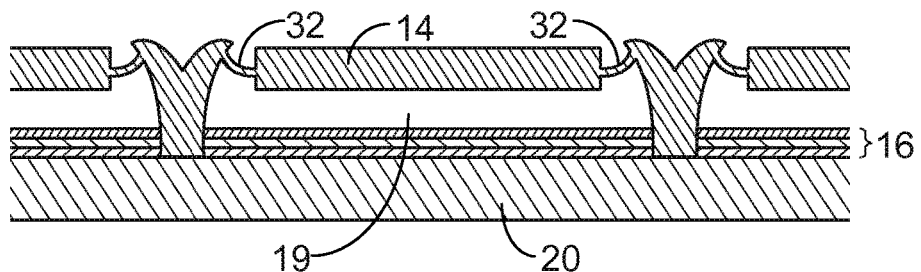
FIGS. 6B-6E show examples of cross-sections of varying implementations of interferometric modulators.
Figure 6C:
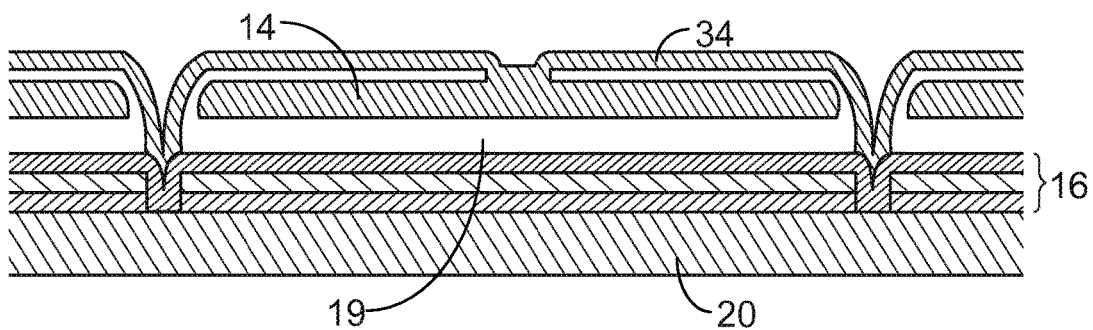

The details of the structure of interferometric modulators that operate in accordance with the principles set forth above may vary widely. For example, FIGS. 6A-6E show examples of cross-sections of varying implementations of interferometric modulators, including the movable reflective layer 14 and its supporting structures. FIG. 6A shows an example of a partial cross-section of the interferometric modulator display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
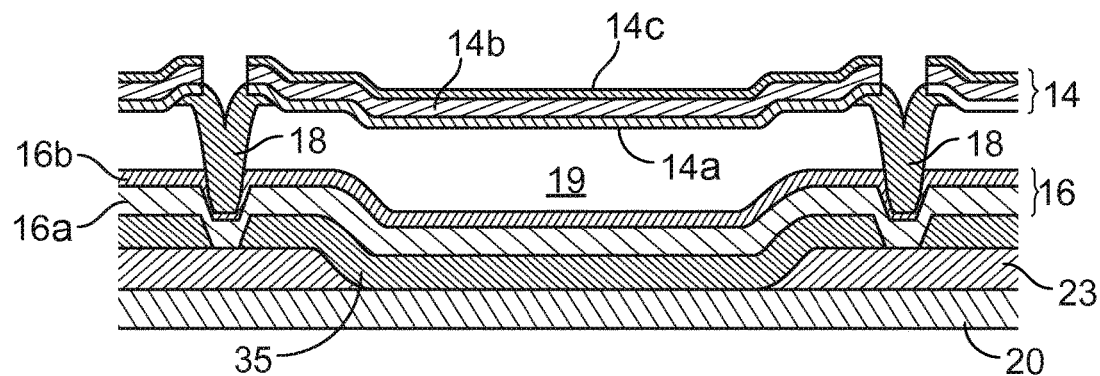

FIG. 6D shows another example of an IMOD, where the movable reflective layer 14 includes a reflective sub-layer 14*a*. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14*c*, which may be configured to serve as an electrode, and a support layer 14*b*. In this example, the conductive layer 14*c* is disposed on one side of the support layer 14*b*, distal from the substrate 20, and the reflective sub-layer 14*a* is disposed on the other side of the support layer 14*b*, proximal to the substrate 20. In some implementations, the reflective sub-layer 14*a* can be conductive and can be disposed between the support layer 14*b* and the optical stack 16. The support layer 14*b* can include one or more layers of a dielectric material, for example, silicon oxynitride (SiON) or silicon dioxide ($SiO_2$). In some implementations, the support layer 14*b* can be a stack of layers, such as, for example, a $SiO_2$/SiON/$SiO_2$ tri-layer stack. Either or both of the reflective sub-layer 14*a* and the conductive layer 14*c* can include, e.g., an aluminum (Al) alloy with about 0.5% copper (Cu), or another reflective metallic material. Employing conductive layers 14*a*, 14*c* above and below the dielectric support layer 14*b* can balance stresses and provide enhanced conduction. In some implementations, the reflective sub-layer 14*a* and the conductive layer 14*c* can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (e.g., between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, an $SiO_2$ layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, carbon tetrafluoromethane ($CF_4$) and/or oxygen ($O_2$) for the MoCr and $SiO_2$ layers and chlorine ($Cl_2$) and/or boron trichloride ($BCl_3$) for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
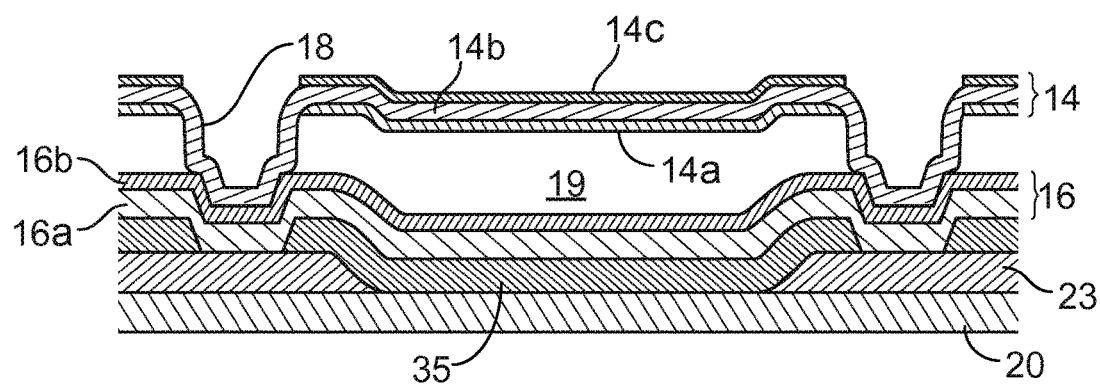

FIG. 6E shows another example of an IMOD, where the movable reflective layer 14 is self-supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the interferometric modulator is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as patterning.

Figure 7:
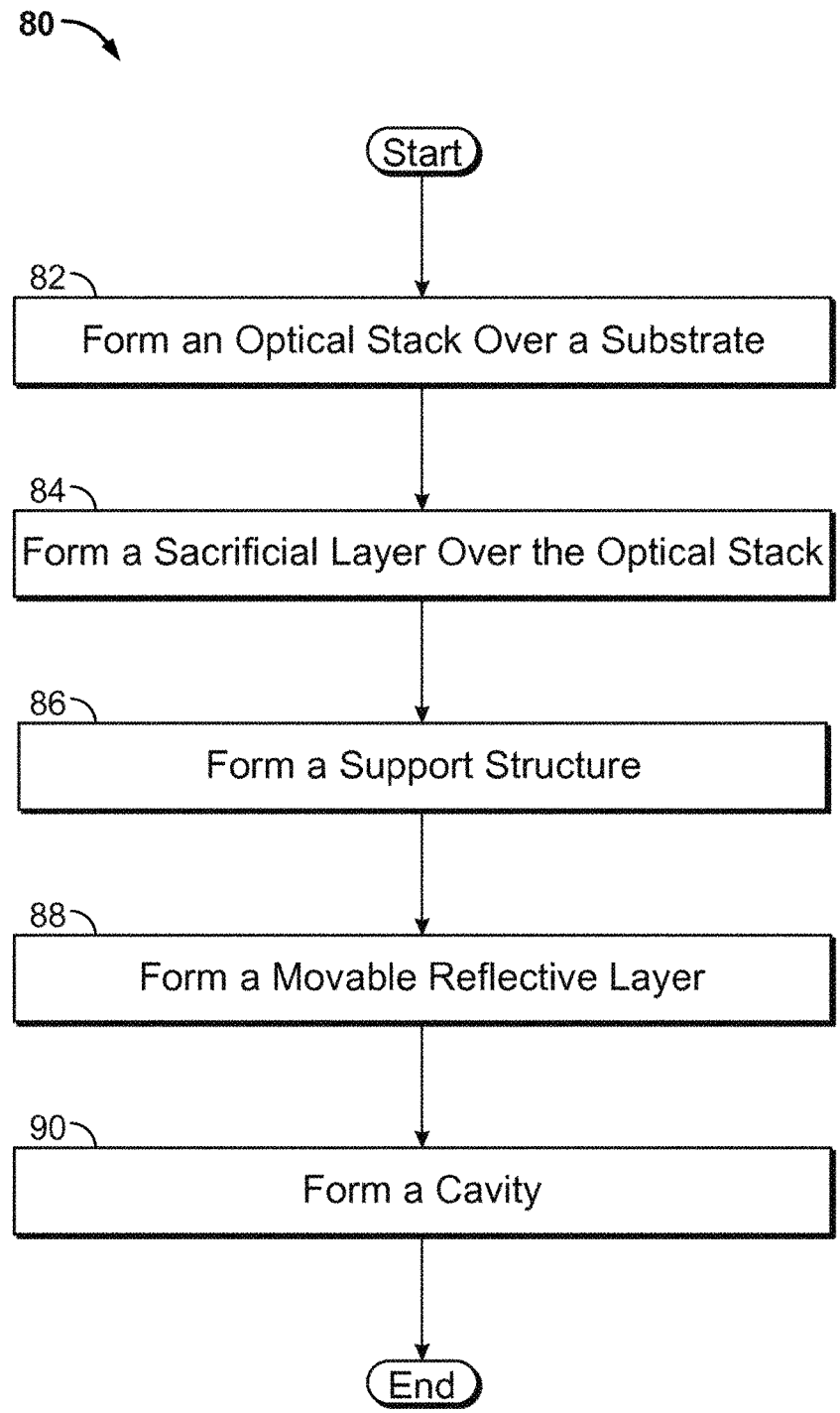
FIG. 7 shows an example of a flow diagram illustrating a manufacturing process for an interferometric modulator.
Figure 8A:
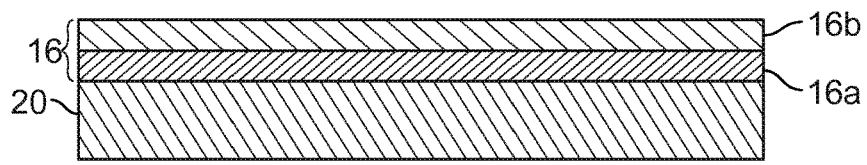
FIGS. 8A-8E show examples of cross-sectional schematic illustrations of various stages in a method of making an interferometric modulator.

FIG. 7 shows an example of a flow diagram illustrating a manufacturing process 80 for an interferometric modulator, and FIGS. 8A-8E show examples of cross-sectional schematic illustrations of corresponding stages of such a manufacturing process 80. In some implementations, the manufacturing process 80 can be implemented to manufacture, e.g., interferometric modulators of the general type illustrated in FIGS. 1 and 6, in addition to other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, e.g., cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display.

Figure 8B:
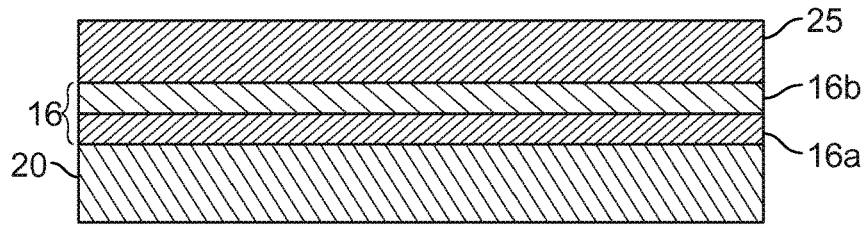

The process 80 continues at block 84 with the formation of a sacrificial layer 25 over the optical stack 16. The sacrificial layer 25 is later removed (e.g., at block 90) to form the cavity 19 and thus the sacrificial layer 25 is not shown in the resulting interferometric modulators 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride ($XeF_2$)-etchable material such as molybdenum (Mo) or amorphous silicon (Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 8C:
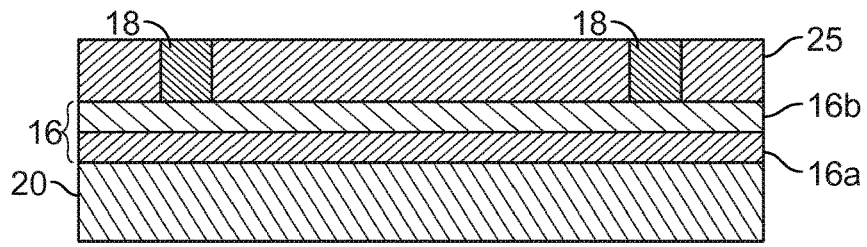

The process 80 continues at block 86 with the formation of a support structure e.g., a post 18 as illustrated in FIGS. 1, 6 and 8C. The formation of the post 18 may include patterning the sacrificial layer 25 to form a support structure aperture, then depositing a material (e.g., a polymer or an inorganic material, e.g., silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning to remove portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
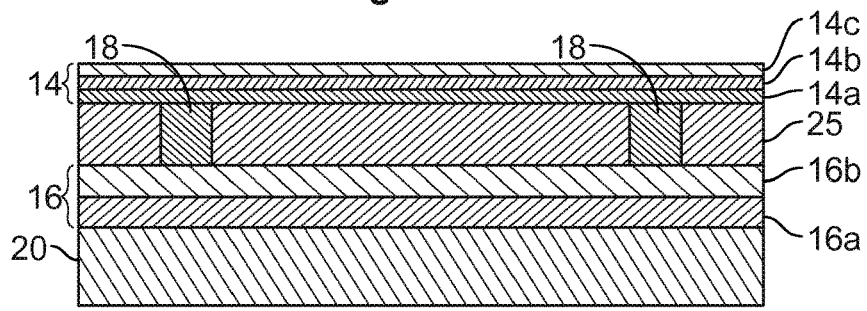
Figure 8E:
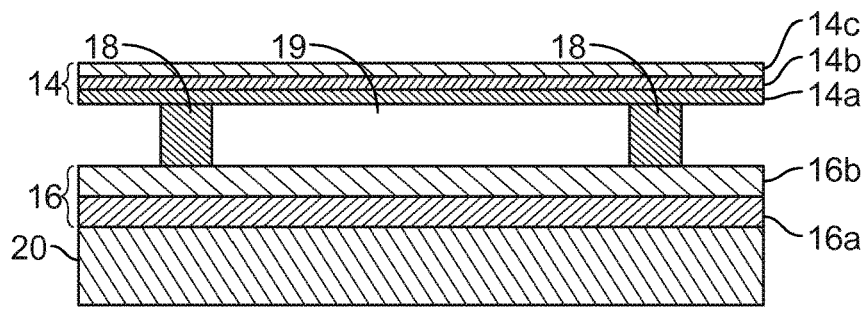

The process 80 continues at block 88 with the formation of a movable reflective layer or membrane such as the movable reflective layer 14 illustrated in FIGS. 1, 6 and 8D. The movable reflective layer 14 may be formed by employing one or more deposition processes, e.g., reflective layer (e.g., aluminum, aluminum alloy) deposition, along with one or more patterning, masking, and/or etching processes. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a, 14c, may include highly reflective sub-layers selected for their optical properties, and another sub-layer 14b may include a mechanical sub-layer selected for its mechanical properties. Since the sacrificial layer 25 is still present in the partially fabricated interferometric modulator formed at block 88, the movable reflective layer 14 is typically not movable at this stage. A partially fabricated IMOD that contains a sacrificial layer 25 also may be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, e.g., cavity 19 as illustrated in FIGS. 1, 6 and 8E. The cavity 19 may be formed by exposing the sacrificial material 25 (deposited at block 84) to an etchant. For example, an etchable sacrificial material such as Mo or amorphous Si may be removed by dry chemical etching, e.g., by exposing the sacrificial layer 25 to a gaseous or vaporous etchant, such as vapors derived from solid $XeF_2$ for a period of time that is effective to remove the desired amount of material, typically selectively removed relative to the structures surrounding the cavity 19. Other combinations of etchable sacrificial material and etching methods, e.g. wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

The vertical integration or interconnection of different semiconductor and/or EMS devices associated with a substrate may impose restrictions on the signal routing between different layers of the devices. Further, there may be challenges related to the processing of different materials in the different layers of the devices.

For example, an apparatus, such as a flat panel display, may include a pixel array that includes a number of pixel devices, such as EMS devices, including IMODs, and other components, such as matrixed active switches and drivers, as well as passive devices such as storage/sensing capacitors and resistors. The pixel devices and other components may include multilayer structures with different materials in the layers. For operation of the apparatus, signals may need to be routed into and out from different layers of each pixel device. Via structures to accomplish this signal routing may occupy a small fraction of the pixel device area in order to have an adequate fill factor. Fabricating the via structures may involve processing different materials in the multilayer structure of a pixel device, which may make the processing complicated.

Alternatively, the fabrication process for a stacked via structure may include etching one layer of material at a time, as described further herein. A stacked via structure may include a plurality of metal layers. The plurality of metal layers may be in contact with one another at a central portion of the stacked via structure. The plurality of metal layers may have dielectric layers disposed between the metal layers in a peripheral portion to the stacked via structure.

Figure 9:
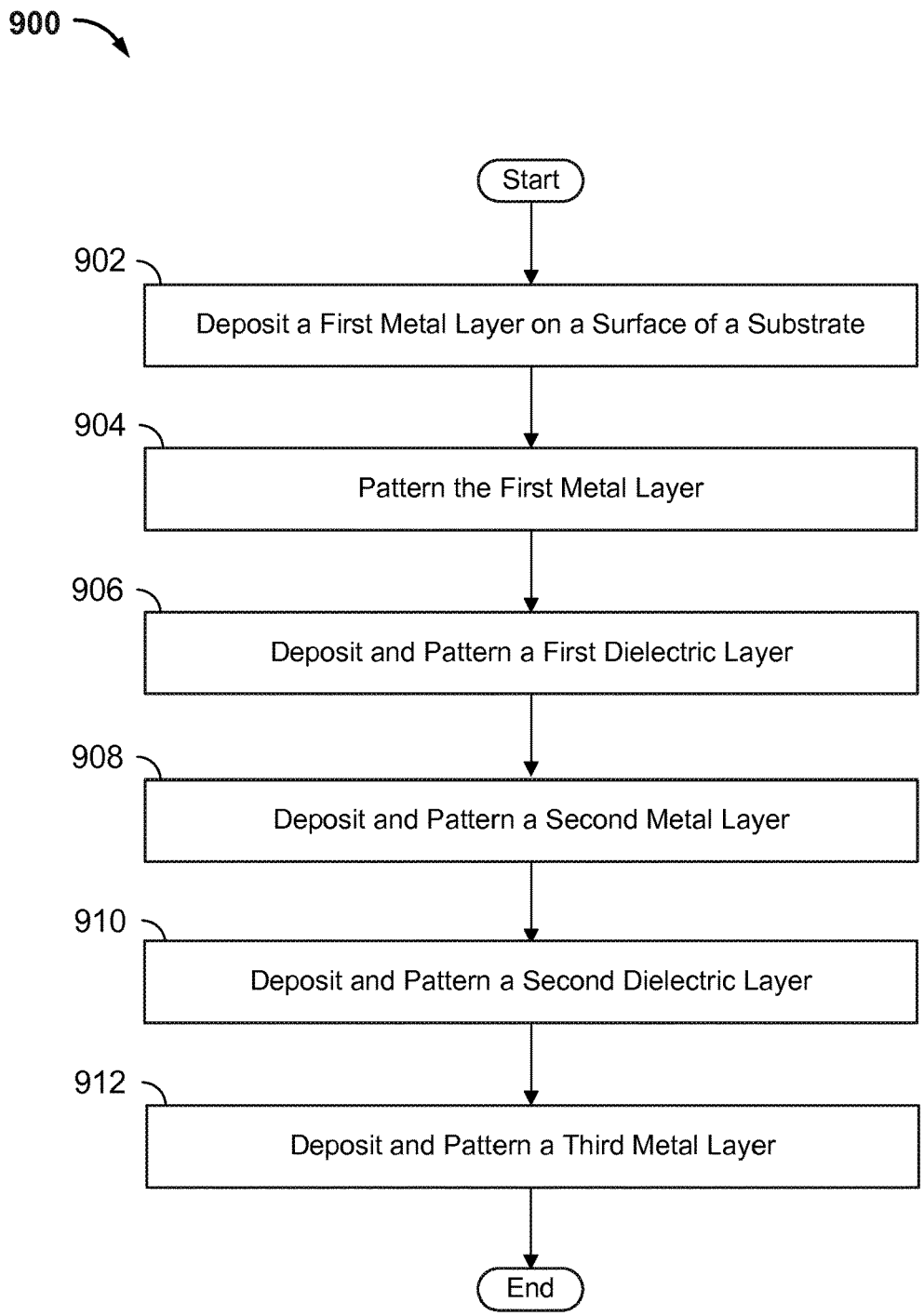
FIG. 9 shows an example of a flow diagram illustrating a manufacturing process for a stacked via structure.

FIG. 9 shows an example of a flow diagram illustrating a manufacturing process for a stacked via structure. FIGS. 10A-10E show examples of cross-sectional schematic illustrations of a stacked via structure at different stages in the process described in FIG. 9. While FIG. 9 illustrates a process for manufacturing a single stacked via structure, multiple stacked via structures may be manufactured simultaneously on a surface of a substrate. Additionally, and for simplification of the illustrations, FIGS. 9 and 10A-10E show a manufacturing process and schematic illustrations for a three stacked via structure. A person having ordinary skill in the art will readily understand that the processes and schematic illustrations can be repeated and/or adjusted to make structures having more, or less than three stacked vias. Further, the process operations described in FIG. 9 used to manufacture a stacked via structure also may be used to fabricate a device, such as a semiconductor device or an EMS device, while manufacturing a stacked via structure.

Turning first to FIG. 9, at block 902 of the process 900, a first metal layer is deposited on the surface of a substrate. The substrate may include different substrate materials, including transparent materials, non-transparent materials, flexible materials, rigid materials, or combination of these. In some implementations, the substrate is silicon, silicon-on-insulator (SOI), a glass (such as a display glass or a borosilicate glass), a flexible plastic, or a metal foil. In some implementations, the substrate may have dimensions of a few microns to hundreds of microns. In some other implementations, the substrate may have dimensions of tens, hundreds, or thousands of centimeters.

The substrate may include a central portion and peripheral portions. These are portions over which the central portion of the stacked via structure and peripheral portions of the stacked via structure may be formed, respectively. In the central portion of a stacked via structure, a plurality of metal layers may be in contact with one another. In peripheral portions of a stacked via structure, each of the plurality of metal layers may have a dielectric layer between it and another metal layer of the plurality of metal layers. The substrate may also include regions extending beyond the peripheral portions. In some implementations, one or more devices, such as semiconductor devices and/or EMS devices, and/or conductive traces from a stacked via structure to one or more devices, may be formed over these extended regions. A stacked via structure also can extend beyond its peripheral portions. In regions of the stacked via structure that extend beyond the peripheral portions, the plurality of metal layers may not be present. When one or more of the plurality of metal layers is present in regions extending beyond the peripheral portions of a stacked via structure, each of the plurality of metal layers may have a dielectric layer between it and another metal layer of the plurality of metal layers.

In some implementations, a surface of the substrate may include a buffer layer. The buffer layer may serve as an insulation surface or passivation layer to seal the surface of the substrate. In some implementations, the buffer layer may be a dielectric, such as $SiO_2$, silicon nitride ($Si_xN$), SiON, silicon carbide (SiC), titanium oxide ($TiO_2$), aluminum oxide ($Al_2O_3$), or spin-on-glass (SOG). In some implementations, the buffer layer may be a polymer such as polyimide, benzocyclobutene (BCB, $C_8H_8$), or a photoresist (e.g., an epoxy-based photoresist). The buffer layer may also be any multi-layered combination of these materials. In some implementations, the buffer layer may be about 100 nanometers (nm) to 10 microns in thickness, such as about 1 micron in thickness.

The first metal layer may be deposited on the central portion and peripheral portions of the substrate. The first metal layer may include any number of different metals, such as aluminum (Al), gold (Au), copper (Cu), molybdenum (Mo), tantalum (Ta), chromium (Cr), neodymium (Nd), tungsten (W), titanium (Ti), nickel (Ni), and an alloy including at least one of these metals, such as MoCr, AlCu, and AlSi. In some implementations, the first metal layer may be less than about 10 nm thick, tens of nanometers thick, hundreds of nanometers thick, or microns thick. The first metal layer may be deposited using a deposition process such as a PVD process, a CVD process, or an atomic layer deposition (ALD) process.

At block 904, the first metal layer is patterned. Patterning techniques, including lithography as well as etching (such as wet etching or dry etching, including plasma etch, reactive ion etch (RIE), ion beam milling, etc.) processes, may be used to define the portions of the substrate including the first metal layer. For example, the first metal layer may be patterned with photoresists after it is formed. The first metal layer may then be etched to remove portions of the first metal layer from selected portions of the surface of the substrate. The first metal layer may be patterned such that the first metal layer forms the central portion of the stacked via structure, conductive traces to a device, and a component of the device.

Figure 10D:
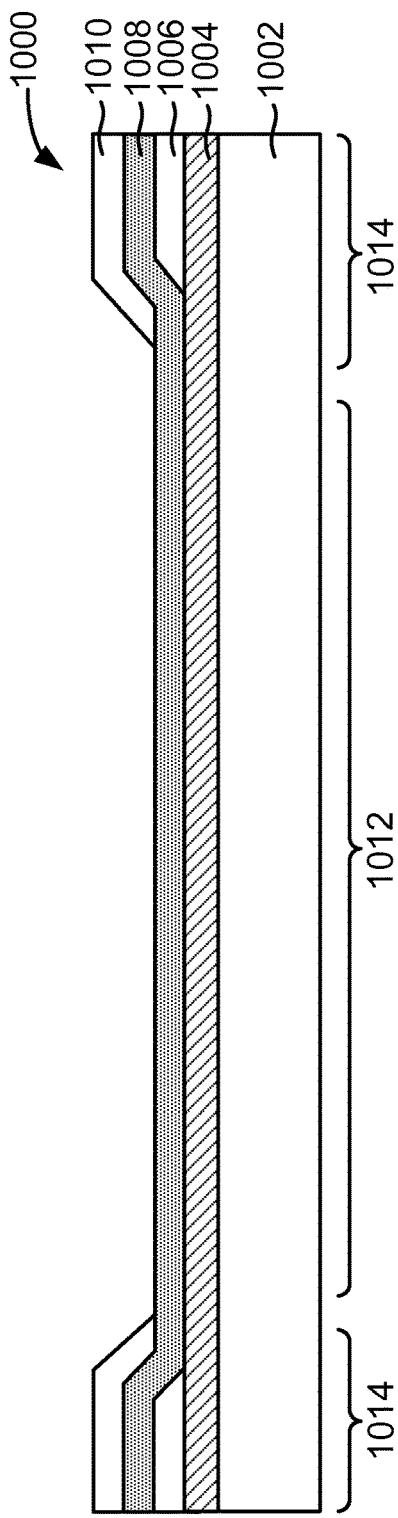

FIG. 10A shows an example of a cross-sectional schematic illustration of a stacked via structure at this point (e.g., up to block 904) in the process 900. The stacked via structure 1000 includes a substrate 1002 and a first metal layer 1004. The substrate 1002 includes a central portion 1012 and peripheral portions 1014. FIGS. 10A-10E show examples of cross-sectional schematic illustrations of a stacked via structure at stages in the process 900. The regions (not shown) extending beyond the peripheral portions 1014 of the substrate 1002 may extend over the substrate and may include conductive traces and/or active and passive devices.

Returning to FIG. 9, at block 906, a first dielectric layer is deposited and patterned. The dielectric of the first dielectric layer may include any number of different dielectrics, such as $SiO_2$, SiC, $Al_2O_3$, hafnium oxide ($HfO_2$), $TiO_2$, SiON, and $Si_xN$. In some implementations, each dielectric layer may be less than about 5 microns thick or less than about 100 nm thick. In some implementations, each dielectric layer may be about tens of nanometers to 1 micron thick, or about 1 micron thick. The first dielectric layer may be deposited using a deposition process such as a PVD process, a CVD process, or an ALD process. The first dielectric layer may be patterned such that the first dielectric layer is not present in the central portion of the stacked via structure but remains in peripheral portions of the stacked via structure. Patterning techniques, including lithography as well as etching processes, as described above, may be used.

FIG. 10B shows an example of a cross-sectional schematic illustration of a stacked via structure 1000 at this point (e.g., up to block 906) in the process 900. The stacked via structure 1000 includes the substrate 1002, the first metal layer 1004, and a first dielectric layer 1006. The first dielectric layer does not overlie the central portion 1012 of the substrate 1002, but does overlie the peripheral portions 1014 of the substrate 1002.

Returning to FIG. 9, the manufacturing process 900 for the stacked via structure continues with depositing a layer of metal, patterning the layer of metal, depositing a layer of dielectric, and patterning the layer of dielectric. These processes may be repeated until a desired stacked via structure is formed. For example, at block 908, a second metal layer is deposited and patterned. In some implementations, the second metal layer may include the same metal as the first metal layer, and in some implementations, the second metal layer may include a different metal from the first metal layer. In some implementations, the second metal layer may be the same thickness as the first metal layer, and in some implementations, the second metal layer may be a different thickness than the first metal layer.

FIG. 10C shows an example of a cross-sectional schematic illustration of a stacked via structure 1000 at this point (e.g., up to block 908) in the process 900. The stacked via structure 1000 includes the substrate 1002, the first metal layer 1004, the first dielectric layer 1006, and a second metal layer 1008. The second metal layer 1008 contacts the first metal layer 1004 in an area partially overlying the central portion 1012 of the substrate 1002 and contacts the first dielectric layer 1006 in areas overlying the peripheral portions 1014. The second metal layer 1008 is conformal to an edge of the first dielectric layer 1006 such that the second metal layer 1008 includes a sloped portion 1054. An angle 1038 that a planar portion 1052 of the second metal layer 1008 makes with the sloped portion 1054 may be about 90 degrees to 150 degrees. In some implementations, subsequent metal layers forming the stacked via structure may include similar sloped portions. Angles between the sloped portions and planar portions of metal layers can be uniform or vary across the stacked via structure. For example, any two metal layers may include the same or different angles.

At block 910 of the process 900 shown in FIG. 9, a second dielectric layer is deposited and patterned. In some implementations, the second dielectric layer may include the same dielectric as the first dielectric layer, and in some implementations, the second dielectric layer may include a different dielectric from the first dielectric layer. In some implementations, the second dielectric layer may be the same thickness as the first dielectric layer, and in some implementations, the second dielectric layer may be a different thickness than the first dielectric layer. The second dielectric layer may be patterned such that the second dielectric layer is not present in the central portion of the stacked via structure but remains in peripheral portions of the stacked via structure.

FIG. 10D shows an example of a cross-sectional schematic illustration of a stacked via structure 1000 at this point (e.g., up to block 910) in the process 900. The stacked via structure 1000 includes the substrate 1002, the first metal layer 1004, the first dielectric layer 1006, the second metal layer 1008, and a second dielectric layer 1010. The second dielectric layer does not overlie the central portion 1012 of the substrate 1002, but does overlie the peripheral portions 1014 of the substrate 1002.

At block 912 of the process 900 shown in FIG. 9, a third metal layer is deposited and patterned. In some implementations, the third metal layer may include the same metal as the first metal layer, and in some implementations, the third metal layer may include a different metal from the first metal layer. In some implementations, the third metal layer may be the same thickness as the first metal layer, and in some implementations, the third metal layer may be a different thickness than the first metal layer.

Figure 10E:
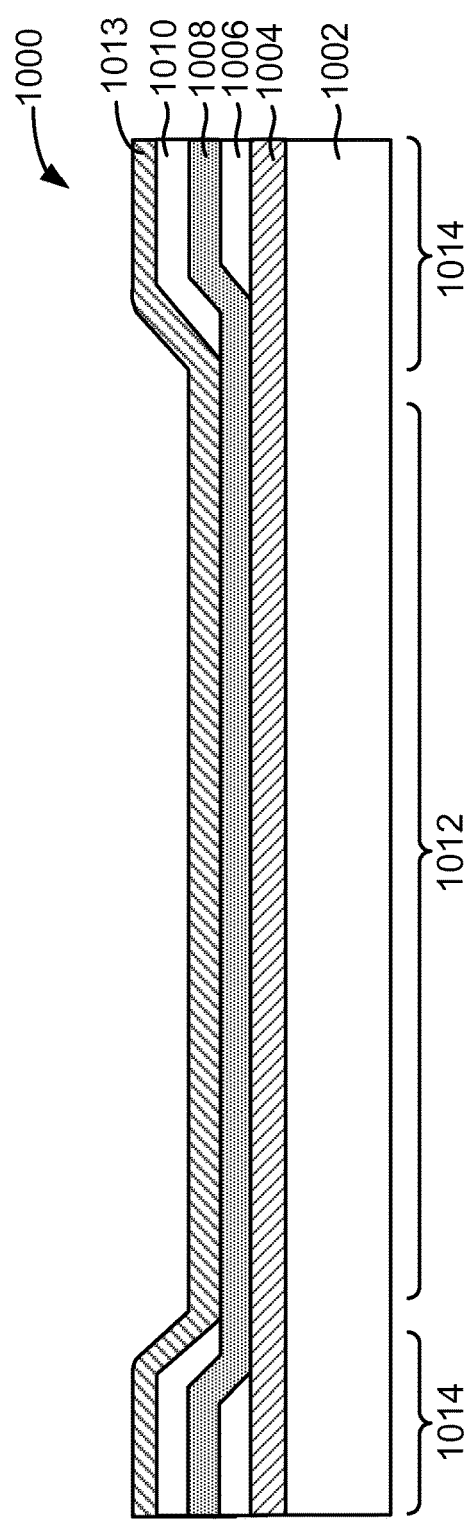

FIG. 10E shows an example of a cross-sectional schematic illustration of a stacked via structure 1000 at this point (e.g., up to block 912) in the process 900. The stacked via structure 1000 includes the substrate 1002, the first metal layer 1004, the first dielectric layer 1006, the second metal layer 1008, the second dielectric layer 1010, and a third metal layer 1013. The third metal layer 1013 contacts the second metal layer 1008 in an area overlying the central portion 1012 of the substrate 1002. Thus, in some implementations, the first metal layer 1004, the second metal layer 1008, and the third metal layer 1013 may be in electrical contact with one another in an area overlying the central portion 1012. In the portions of the stacked via structure overlying the peripheral portions of the substrate 1014, dielectric layers may be present between the metal layers. In the example of FIG. 10E, the first dielectric layer 1006 separates the first metal layer 1004 and the second metal layer 1008 in areas overlying the peripheral portions 1014. Similarly, the second dielectric layer 1010 separates the second metal layer 1008 and the third metal layer 1013 in areas overlying the peripheral portions 1014. Thus, in some implementations, the first metal layer 1004, the second metal layer 1008 and the third metal layer 1013 may be electrically isolated from each other in areas overlying the peripheral portions 1014 of the substrate 1002.

In the process 900 for the formation of a stacked via structure, one type of material is being patterned at a time. For example, at block 904, the first metal layer is patterned, which may include etching the first metal layer. At block 906, the first dielectric layer is patterned, which may include etching the first dielectric layer. Blocks 908, 910, and 912 in the process 900 are similar in that one layer is patterned at a time. In some implementations, patterning a single layer at a time can include etching the layer. Etching a single material at a time may aid in the fabrication process of a stacked via structure. For example, if different materials are etched in the manufacturing process for a stacked via structure, the process may become more complex due to etchants etching different materials at different rates or due to the use of etch stop layers.

Further, while the process 900 can result in the stacked via structure 1000 as shown in FIG. 10E including three metal layers and two dielectric layers, the process 900 may continue with the deposition and patterning of metal layers and dielectric layers. For example, a stacked via structure may include any number of metal layers and dielectric layers that separate the metal layers in the peripheral portions of the stacked via structure. For example, a stacked via structure may include 2 to 12 metal layers, and in some implementations can include more than 12 layers, depending on the design configurations.

Figure 11A:
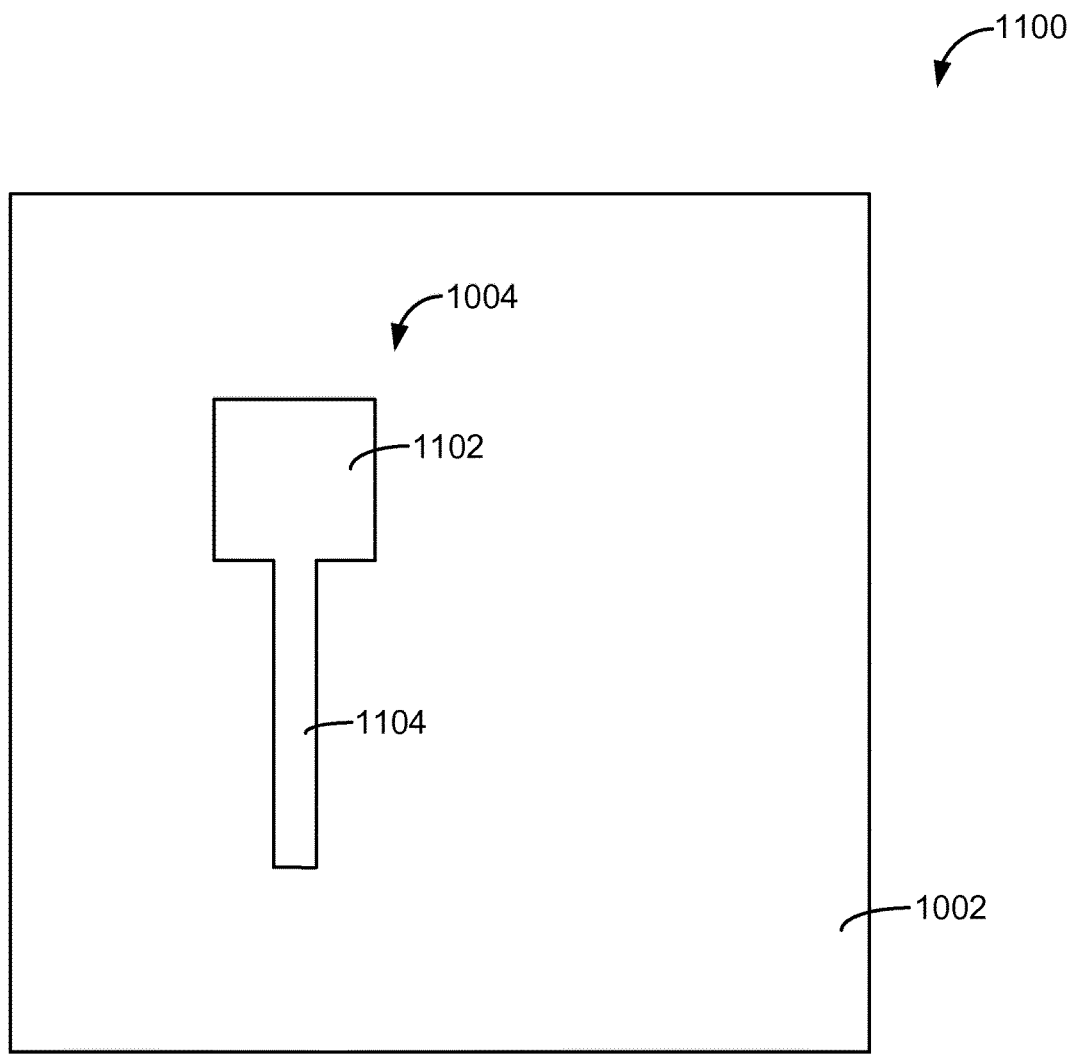
FIGS. 11A-11F show examples of top-down views of two stacked via structures at different stages in a manufacturing process.

FIGS. 11A-11F show examples of top-down views of two stacked via structures at different stages in a manufacturing process. For purposes of illustration, the peripheral portions of the stacked via structures are not indicated in FIGS. 11A-11F. For example, FIG. 11A may be an example of an apparatus formed after blocks 902 and 904 of the process 900 shown in FIG. 9. An apparatus 1100 as shown in FIG. 11A includes a substrate 1002 with a first metal layer 1004 deposited and patterned. The first metal layer 1004 is patterned to include a central portion 1102 of a first stacked via structure and a conductive trace 1104 coupled to the central portion 1102. The conductive trace 1104 may be in a region extending beyond peripheral portions of the first stacked via structure. The end of the conductive trace may be coupled to a first device (not shown) or form part of a first device (not shown) on the surface of the substrate 1002.

In FIG. 11A, the central portion 1102 of the first stacked via structure is shown as having a substantially square shape. A side of the square central portion 1102 of the first stacked via structure may have a dimension of about 0.1 microns to 1 micron, about 1 micron to 5 microns, about 15 microns to 45 microns, or about 10 microns to 100 microns, in some implementations. The central portion 1102 of the first stacked via structure also may have other shapes, including a rectangular shape, a circular shape, or an oval shape, in some implementations. A dimension of a central portion of such a first stacked via structure also may be about 0.1 microns to 1 micron, about 1 micron to 5 microns, about 15 microns to 45 microns, or about 10 microns to 100 microns, in some implementations.

Figure 11B:
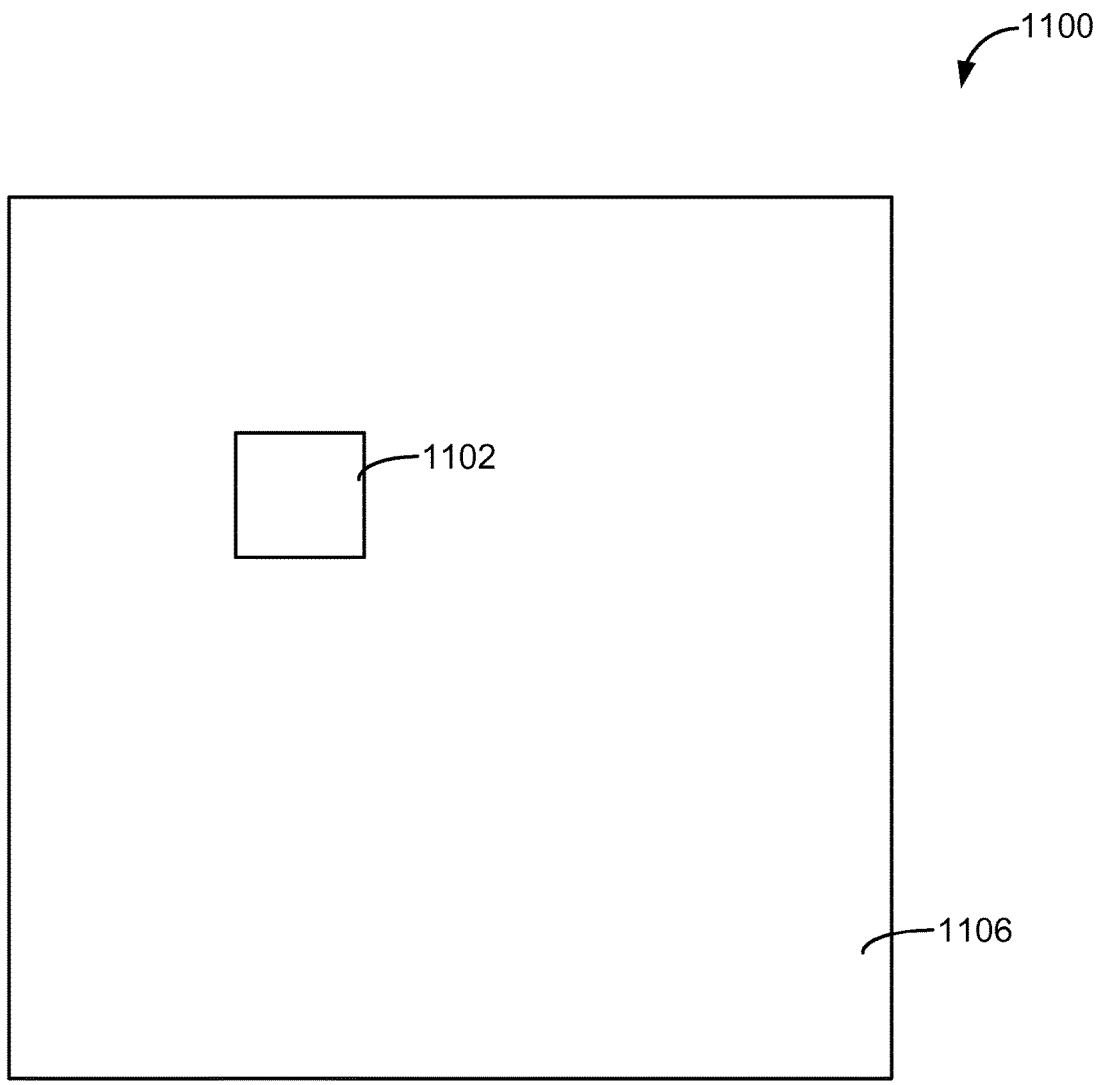

FIG. 11B shows the apparatus 1100 after a first dielectric layer 1006 is deposited and patterned. For example, FIG. 11B may be an example of an apparatus formed after block 906 of the process 900 shown in FIG. 9. The dielectric layer 1006 covers the conductive trace 1104. The dielectric layer 1006 is patterned to expose the central portion 1102 of the first stacked via structure. In some implementations, the first dielectric layer 1006 can be part of an EMS device, a transistor, or a capacitor. For example, the dielectric layer 1006 can be formed as a gate dielectric for a transistor, an insulator for a capacitor, or one of a variety of functional structures for an EMS device.

Figure 11C:
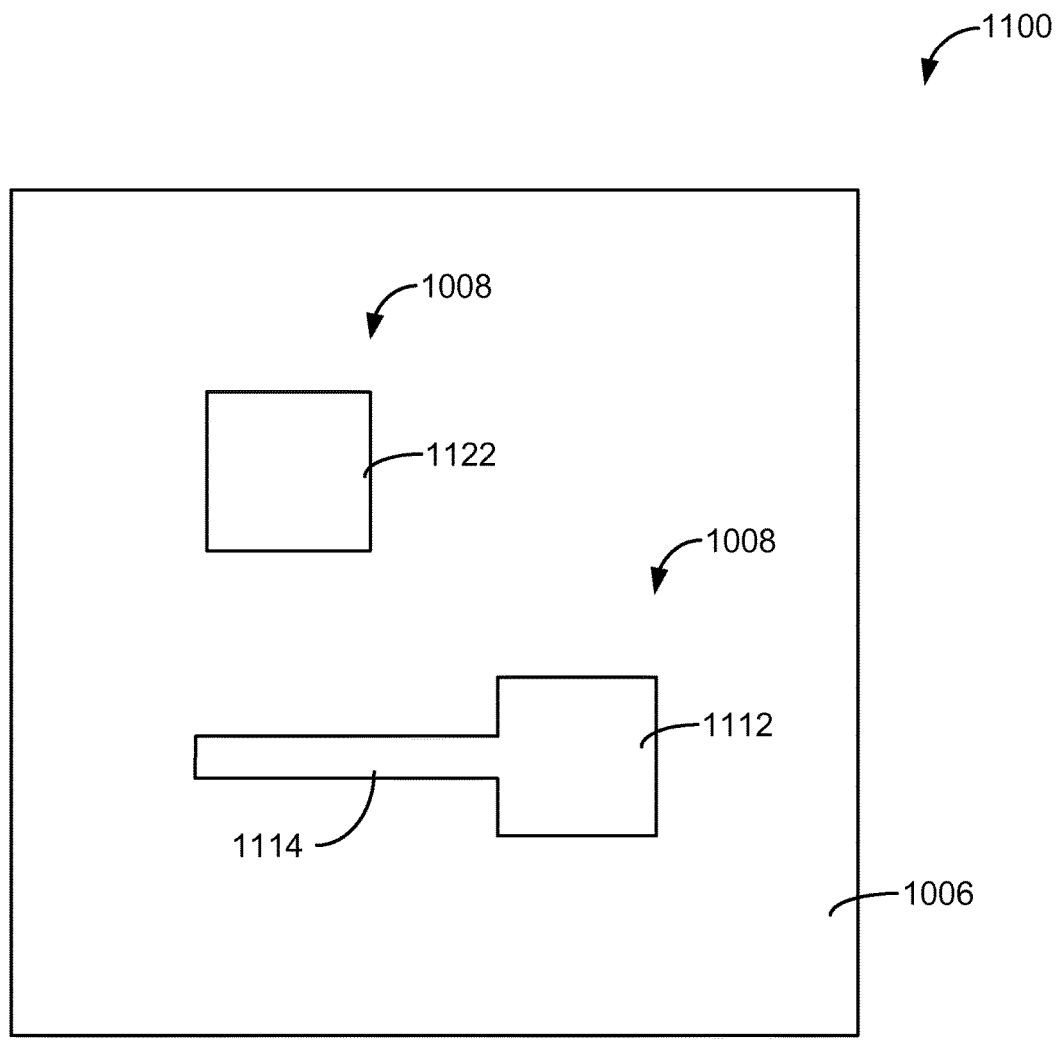

FIG. 11C shows the apparatus 1100 after a second metal layer 1108 is deposited and patterned. For example, FIG. 11C may be an example of an apparatus formed after block 908 of the process 900 shown in FIG. 9. The second metal layer 1008 is patterned to include a central portion 1122 of a first stacked via structure. The second metal layer also is patterned to include a central portion 1112 of a second stacked via structure and a conductive trace 1114 coupled to the central portion 1112. The conductive trace 1114 may be in a region extending beyond peripheral portions of the second stacked via structure. The end of the conductive trace may be coupled to the first device (not shown) or form part of the first device (not shown) on the surface of the substrate 1002.

Figure 11D:
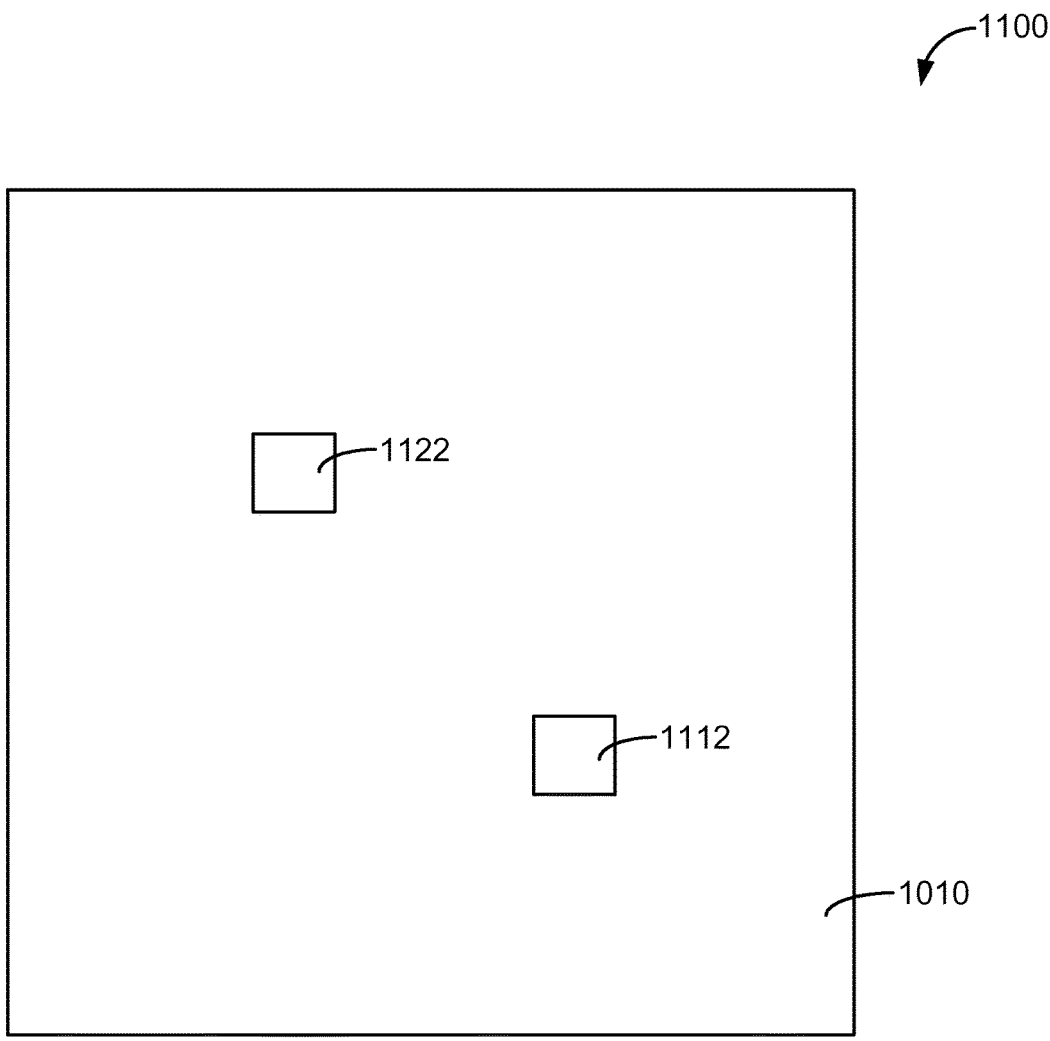

FIG. 11D shows the apparatus 1100 after a second dielectric layer 1010 is deposited and patterned. For example, FIG. 11D may be an example of an apparatus formed after block 910 of the process 900 shown in FIG. 9. The second dielectric layer 1010 covers the conductive trace 1114. The second dielectric layer 1010 can be patterned to expose the central portion 1122 of the first stacked via structure and the central portion 1112 of the second stacked via structure. Similar to the first dielectric layer 1006 as described above, the second dielectric layer 1010 also can be part of an EMS device, a transistor, or a capacitor. For example, the second dielectric layer 1010 can be formed as a gate dielectric for a transistor, an insulator for a capacitor, or one of a variety of functional structures for EMS devices.

Figure 11E:
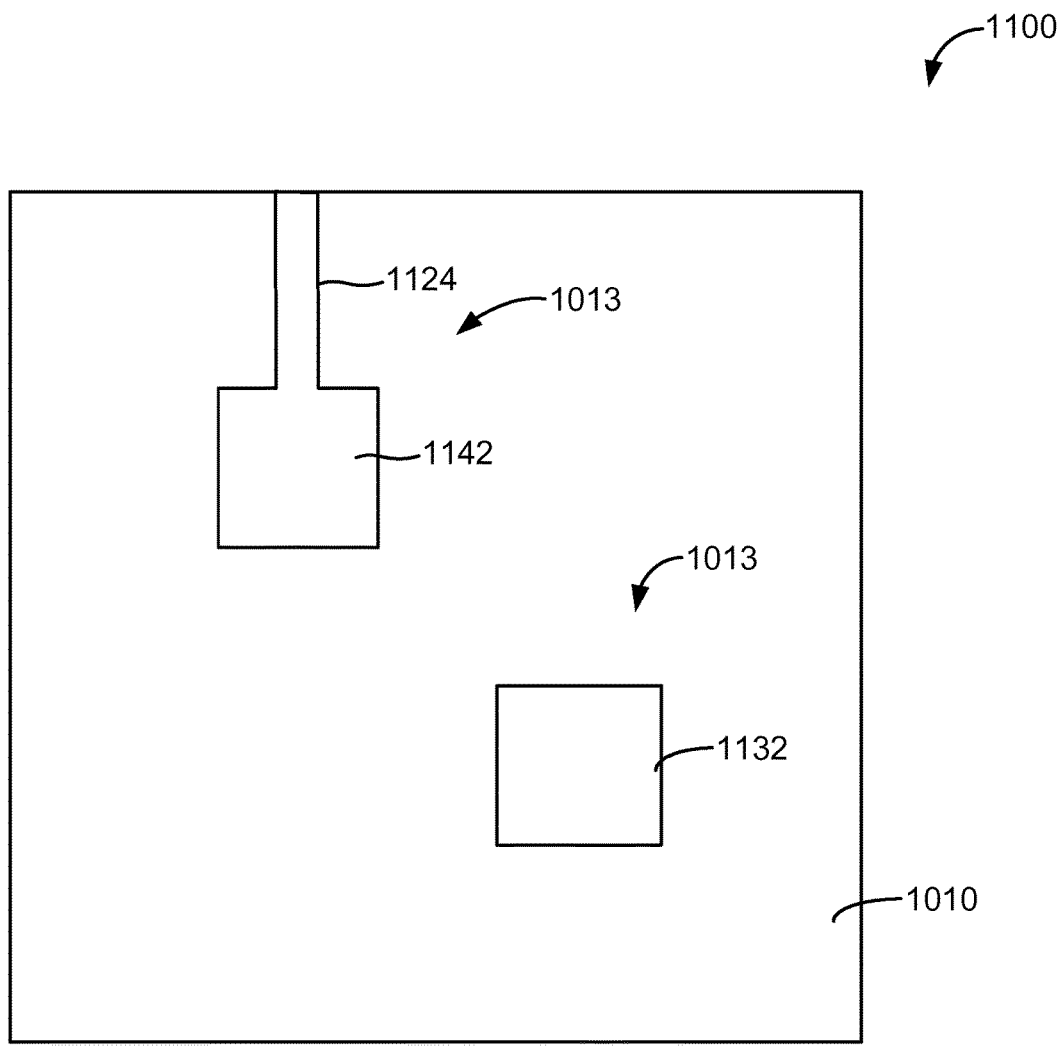

FIG. 11E shows the apparatus 1100 after a third metal layer 1013 is deposited and patterned. For example, FIG. 11E may be an example of an apparatus formed after block 912 of the process 900 shown in FIG. 9. The third metal layer 1013 is patterned to include a central portion 1132 of the second stacked via structure. The third metal layer 1013 also can be patterned to include a central portion 1142 of the first stacked via structure and a conductive trace 1124 coupled to the central portion. The conductive trace 1124 may be in a region extending beyond peripheral portions of the first stacked via structure. The end of the conductive trace, for example, may be coupled to a second device (not shown) to be fabricated on the surface of the substrate or form part of the second device (not shown) to be fabricated on the surface of the substrate 902. Alternatively, the end of the conductive trace may provide an interconnect to another device or system (not shown) on another substrate. The third metal layer 1013 included in the central portion 1132 of the second stacked via structure may provide an interconnect to the first device (not shown).

Figure 11F:
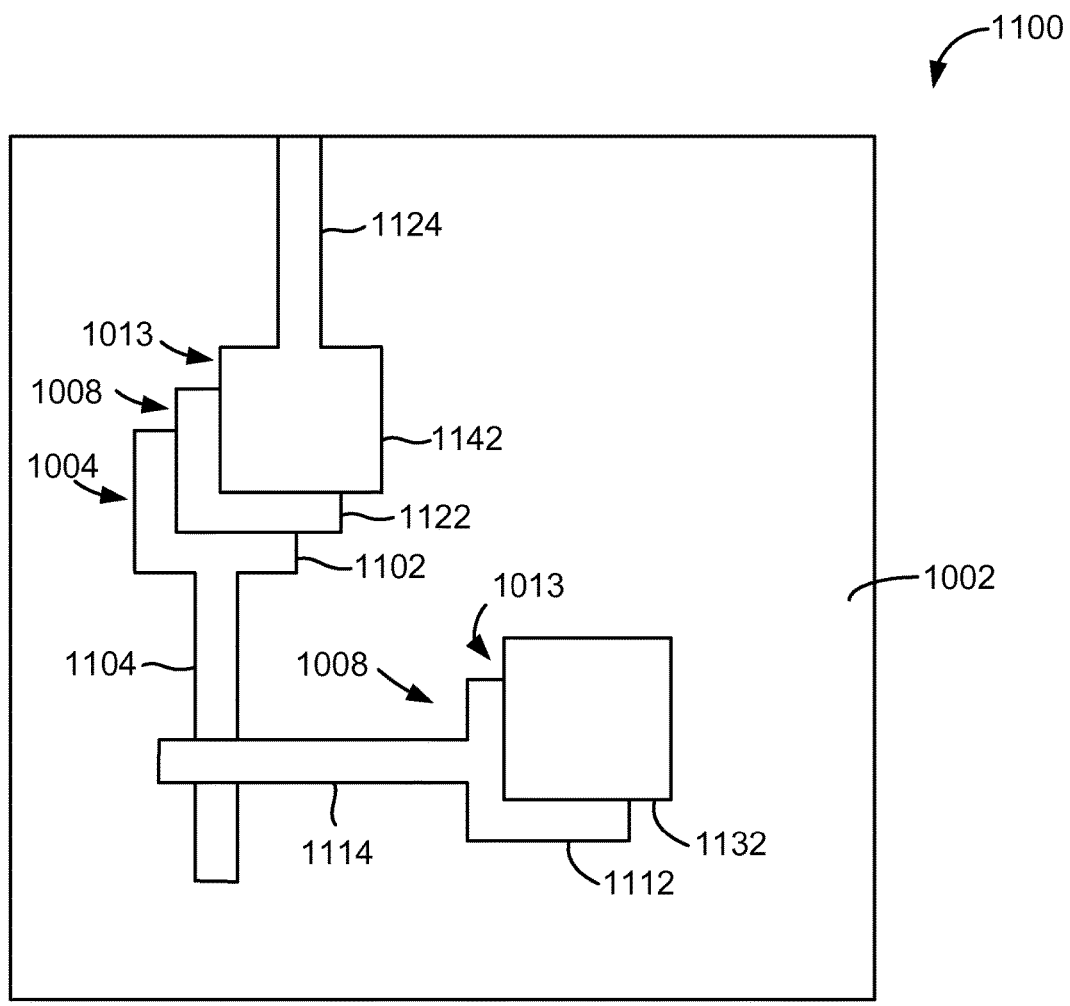

FIG. 11F shows a top-down view of the apparatus 1100. For the purposes of illustration, FIG. 11F depicts the metal layers being offset from one another and excludes the dielectric layers. The apparatus 1100 includes the substrate 1002 with the first metal layer 1004 deposited and patterned on the surface of the substrate 1002. The first metal layer 1004 includes the central portion 1102 of the first stacked via structure and the conductive trace 1104 coupled to the central portion 1102. The second metal layer 1008 that is deposited and patterned includes the central portion 1122 of the first stacked via structure. The second metal layer 1008 also includes the central portion 1112 of the second stacked via structure and the conductive trace 1114 coupled to the central portion 1112. The third metal layer 1013 that is deposited and patterned includes the central portion 1132 of the second stacked via structure. The third metal layer 1013 also includes the central portion 1142 of the first stacked via structure and the conductive trace 1124 coupled to the central portion 1142.

Figure 12:
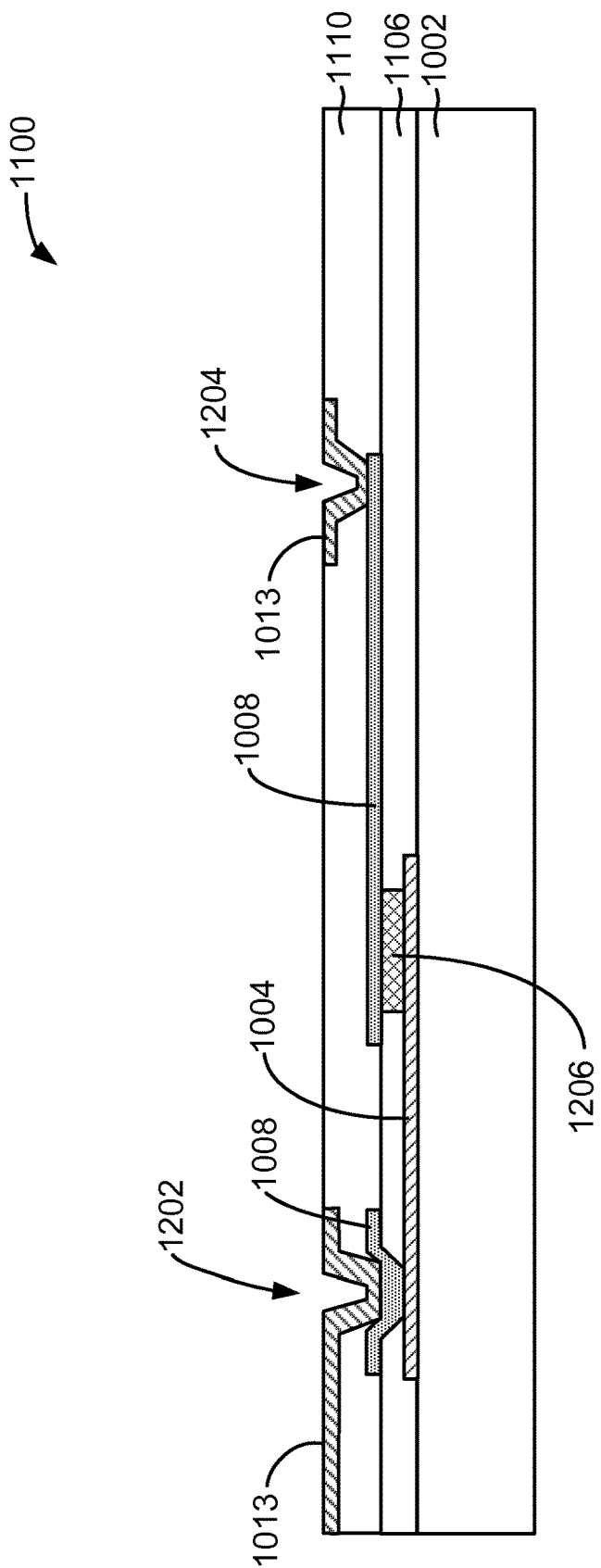
FIG. 12 shows an example of a projected cross-sectional schematic illustration of stacked via structures.

FIG. 12 shows an example of a projected cross-sectional schematic illustration of stacked via structures. FIG. 12 shows an example of a projected cross-sectional schematic illustration of the apparatus 1100 shown in FIGS. 11A-11F. As described above, the apparatus 1100 includes the substrate 1002, the first metal layer 1004, the first dielectric layer 1006, the second metal layer 1008, the second dielectric layer 1010, and the third metal layer 1013. Some of the metal layers and dielectric layers are included in the first stacked via structure 1202, the second stacked via structure 1204, and a first device 1206. The first metal layer 1004 forms part of the first stacked via structure 1202 as well as a conductive trace to the first device 1206. The metal layers 1004, 1008, and 1013 can be in electrical contact with one another at a central portion of the first stacked via structure 1202.

The second metal layer 1008 forms part of the second stacked via structure 1204 as well as a conductive trace to the first device 1206. The metal layers 1008 and 1013 can be in electrical contact with one another at a central portion of the second stacked via structure 1204.

As shown in FIG. 12, the first metal layer 1004 and/or the second metal layer 1008 may form part of the first device 1206. For example, the first metal layer 1004 and/or the second metal layer 1008 may form a gate electrode of a thin-film transistor device, an electrode of a storage capacitor device, a component of a resistor device, or part of a hinge structure, a mirror stack, a composite membrane, a cantilever, or a beam of an EMS device or an EMS display device. In some implementations, the first dielectric layer 1006 and/or the second dielectric layer 1010 also can be included in the first device 1206. For example, the first dielectric layer 1106 and/or the second dielectric layer 1110 may form a gate dielectric of a thin-film transistor device, a dielectric layer of a storage capacitor device, a post structure for a movable layer of an EMS display device, or a cantilever, a beam, or a composite membrane of an EMS device.

In some implementations, the first metal layer 1004 and the second metal layer 1008 may include conductive traces to the first device 1206 without forming part of the first device 1206.

Further, as shown in FIG. 12, the stacked via structures 1202 and 1204 allow for connection to the device 1206 from the top of the apparatus 1100 (e.g., using the second stacked via structure 1204) or from the side of the apparatus 1100 (e.g., with the trace coupled to the first via structure 1202).

As described herein, forming a stacked via structure may include deposition and patterning processes. The layers making up a stacked via structure also may be included in a device, such as a semiconductor device, passive devices such as storage/sensing capacitors and resistors, or an EMS device. The layers for such a device may be deposited and patterned concurrently with the deposition and patterning of the layers for the stacked via structure. For example, a device being fabricated concurrently with a stacked via structure or structures may include an IMOD or a thin-film transistor device. One metal layer may be deposited and patterned and may form an electrode layer of an optical stack of an IMOD pixel, a conductive trace, and a metal layer in a first stacked via structure. The electrode layer of the optical stack, the conductive trace, and the first stacked via structure may be electrically connected. Thus, the stacked via structure may provide an interconnect to the IMOD pixel. A second metal layer also may be deposited and patterned and may form a reflective layer of an IMOD pixel, a conductive trace, and a metal layer in a second stacked via structure. The reflective layer, the conductive trace, and the second stacked via structure may be electrically connected. Thus, the second stacked via structure may provide another interconnect to the IMOD pixel.

Alternatively, in a fabrication process for a device on the surface of the substrate, a stacked via structure may be fabricated. After the via is fabricated, when further process operations are used to fabricate the device, the via may be masked off and further layers of materials may not be deposited on the stacked via structure.

Figure 13A:
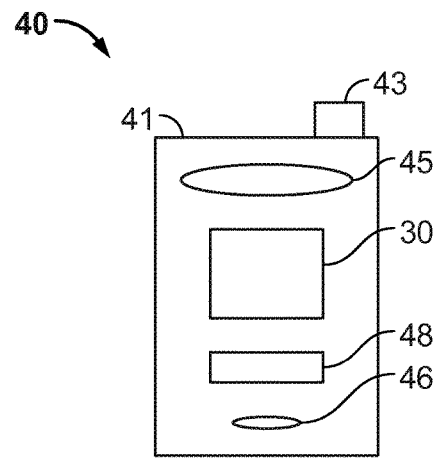
FIGS. 13A and 13B show examples of system block diagrams illustrating a display device that includes a plurality of interferometric modulators.
Figure 13B:
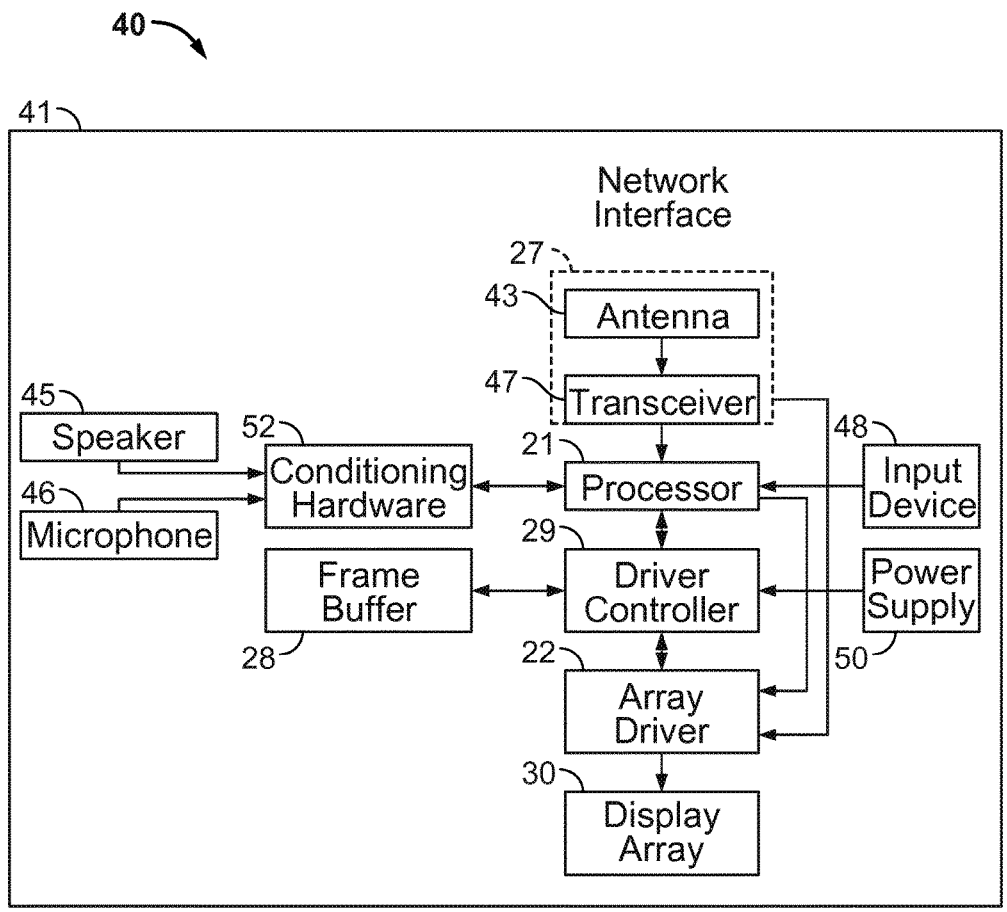

FIGS. 13A and 13B show examples of system block diagrams illustrating a display device 40 that includes a plurality of interferometric modulators. The display device 40 can be, for example, a smart phone, a cellular or mobile telephone. However, the same components of the display device 40 or slight variations thereof are also illustrative of various types of display devices such as televisions, tablets, e-readers, hand-held devices and portable media players.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 13B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other possibilities or implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of an IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one or more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
 a substrate;
 a first electromechanical systems (EMS) device, the first EMS device including a first metal layer and a second metal layer;
 a first via structure on the surface of the substrate, the first via structure including the first metal layer, the second metal layer, and a third metal layer, the second metal layer being disposed on the first metal layer and the third metal layer being disposed on the second metal layer at a central portion of the first via structure, wherein the first metal layer of the first EMS device is coupled to the first metal layer of the first via structure, wherein the second metal layer includes a planar portion and sloped portion and the third metal layer includes a planar portion and a sloped portion, and wherein the first metal layer of the first EMS device and the first metal layer of the first via structure are the same metal layers;
 a first dielectric layer that includes a portion that contacts and is between a top surface of the first metal layer and a bottom surface of the sloped portion of the second metal layer;
 a second dielectric layer that includes a portion that contacts and is between a top surface of the second metal layer and a bottom surface of the sloped portion of the third metal layer; and an electronic component disposed over the first via structure and coupled to the third metal layer to thereby electrically connect the electronic component to the first EMS device, wherein each of the first dielectric layer and the second dielectric layer is between about 10 nm to about 1 micron thick.

2. The apparatus of claim 1, wherein the first EMS device includes a first pixel device.

3. The apparatus of claim 2, further comprising:
an array of pixel devices, wherein the first pixel device is part of the array of pixel devices.

4. The apparatus of claim 2, wherein the first pixel device includes an interferometric modulator.

5. The apparatus of claim 1, wherein the first metal layer, the second metal layer, and the third metal layer of the first via structure are in electrical contact with one another at the central portion of the first via structure.

6. The apparatus of claim 1, wherein the central portion of the first via structure has a substantially square shape.

7. The apparatus of claim 1, further comprising:
a device being coupled to the first metal layer of the first via structure, thereby coupling the device to the first EMS device.

8. The apparatus of claim 7, wherein the device includes a thin-film transistor device.

9. The apparatus of claim 1, further comprising:
a plurality of via structures on the surface of the substrate, the plurality of via structures including the first via structure and a second via structure, the second via structure including the second metal layer and the third metal layer, the third metal layer being disposed on the second metal layer at a central portion of the second via structure.

10. The apparatus of claim 9, wherein the second metal layer of the first EMS device is coupled to the second metal layer of the second via structure, and wherein the second metal layer of the first EMS device and the second metal layer of the second via structure are the same metal layers.

11. The apparatus of claim 9, wherein the second metal layer and the third metal layer of the second via structure are in electrical contact with one another at the central portion of the second via structure.

12. The apparatus as recited in claim 1, further comprising:
a display;
a processor that is configured to communicate with the display, the processor being configured to process image data; and
a memory device that is configured to communicate with the processor.

13. The apparatus as recited in claim 12, further comprising:
a driver circuit configured to send at least one signal to the display; and
a controller configured to send at least a portion of the image data to the driver circuit.

14. The apparatus as recited in claim 12, further comprising:
an image source module configured to send the image data to the processor, wherein the image source module includes at least one of a receiver, transceiver, and transmitter.

15. The apparatus as recited in claim 12, further comprising:

an input device configured to receive input data and to communicate the input data to the processor.

16. An apparatus comprising:
a substrate;
a first electromechanical systems (EMS) device on a surface of the substrate, the first EMS device including a first metal layer and a second metal layer; and
a first via structure on the surface of the substrate, the first via structure including the first metal layer, the second metal layer, a third metal layer, and a fourth metal layer, the second metal layer being disposed on the first metal layer, the third metal layer being disposed on the second metal layer, and the fourth metal layer being disposed on the third metal layer at a central portion of the first via structure, wherein the second metal layer includes a planar portion and sloped portion and the third metal layer includes a planar portion and a sloped portion, wherein the first metal layer of the first EMS device is coupled to the first metal layer of the first via structure, and wherein the first metal layer of the first EMS device and the first metal layer of the first via structure are the same metal layers;
a first dielectric layer that includes a portion that contacts and is between a top surface of the first metal layer and a bottom surface of the sloped portion of the second metal layer;
a second dielectric layer that includes a portion that contacts and is between a top surface of the second metal layer and a bottom surface of the sloped portion of the third metal layer; and
an electronic component disposed over the first via structure and coupled to the third metal layer to thereby electrically connect the electronic component to the first EMS device,
wherein each of the first dielectric layer and the second dielectric layer is between about 10 nm to about 1 micron thick.

17. The apparatus of claim 16, wherein the first metal layer, the second metal layer, the third metal layer, and the fourth metal layer of the first via structure are in electrical contact with one another at the central portion of the first via structure.

18. The apparatus of claim 16, further comprising:
a plurality of via structures, the plurality of via structures including the first via structure and a second via structure, the second via structure including the second metal layer, the third metal layer, and the fourth metal layer, the third metal layer being disposed on the second metal layer and the fourth metal layer being disposed on the third metal layer at a central portion of the second via structure.

19. The apparatus of claim 18, wherein the second metal layer, the third metal layer, and the fourth metal layer of the second via structure are in electrical contact with one another at the central portion of the second via structure.

20. The apparatus of claim 1, wherein the second metal layer includes a second sloped portion, the third metal layer includes a second sloped portion, a portion of the first dielectric layer is between a top surface of the first metal layer and a bottom surface of the second sloped portion of the second metal layer, and a portion of the second dielectric layer contacts and is between a top surface of the second metal layer and a bottom surface of the second sloped portion of the third metal layer.

21. The apparatus of claim 1, wherein the electronic component is a drive circuit.

22. The apparatus of claim 1, wherein each of the first dielectric layer and the second dielectric layer is less than about 100 microns thick.

* * * * *